US006998572B2

(12) United States Patent  (10) Patent No.: US 6,998,572 B2
Endo et al.  (45) Date of Patent: Feb. 14, 2006

(54) LIGHT ENERGY PROCESSING DEVICE AND METHOD

(75) Inventors: Tadashi Endo, Osaka (JP); Masahiro Sato, Hyogo (JP); Koji Fujii, Osaka (JP); Dokei Nagayasu, Hyogo (JP); Mamoru Watanabe, Hyogo (JP); Yasuhiro Goto, Hyogo (JP); Hisahide Ishino, Ishikawa (JP); Kenshi Kotani, Hyogo (JP); Hiroyuki Kuriaki, Osaka (JP); Takashi Shimizu, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 44 days.

(21) Appl. No.: 10/433,999

(22) PCT Filed: Sep. 27, 2002

(86) PCT No.: PCT/JP02/10122

§ 371 (c)(1),
(2), (4) Date: Jun. 10, 2003

(87) PCT Pub. No.: WO03/028932

PCT Pub. Date: Apr. 10, 2003

(65) Prior Publication Data

US 2004/0050905 A1    Mar. 18, 2004

(30) Foreign Application Priority Data

Sep. 28, 2001   (JP)  ............................ 2001-300656

(51) Int. Cl.
 *B23K 1/005*  (2006.01)
 *B23K 26/20*  (2006.01)
(52) U.S. Cl. ..................... 219/121.85; 219/121.61; 219/121.63; 219/121.83

(58) Field of Classification Search ........... 219/121.85, 219/121.63, 121.64, 121.62, 121.82, 121.83, 219/85.12, 85.13; 228/101
See application file for complete search history.

(56) References Cited

U.S. PATENT DOCUMENTS

| | | | | |
|---|---|---|---|---|
| 4,327,277 A | * | 4/1982 | Daly | 219/121.64 |
| 4,792,658 A | * | 12/1988 | Langhans et al. | 219/121.63 |
| 4,806,728 A | * | 2/1989 | Salzer et al. | 219/121.63 |
| 4,995,921 A | * | 2/1991 | Davis et al. | 148/22 |
| 5,153,409 A | * | 10/1992 | Rudaitis et al. | 219/121.83 |
| 5,681,490 A | * | 10/1997 | Chang | 219/121.64 |
| 6,291,794 B1 | * | 9/2001 | Dulaney | 219/121.61 |
| 2001/0019075 A1 | * | 9/2001 | Abe et al. | 228/224 |

FOREIGN PATENT DOCUMENTS

GB   2261620 A  *  5/1993

(Continued)

OTHER PUBLICATIONS

International Search Report for PCT Application No. PCT/JP02/10122 dated Dec. 23, 2002.

(Continued)

*Primary Examiner*—Geoffrey S. Evans
(74) *Attorney, Agent, or Firm*—RatnerPrestia

(57) ABSTRACT

A machining apparatus includes a light source (1) for generating light energy, an optical system (2, 3) for guiding the generated light energy to a joint position of a workpiece, a table (5a) on which the workpiece is mounted, and a heating device (5b) provided at the table for heating the workpiece. The machining apparatus, a machining method and production equipment using the machining apparatus allow the workpiece to be locally heated fast, which is applicable to soldering or the like.

36 Claims, 30 Drawing Sheets

FOREIGN PATENT DOCUMENTS

| | | | |
|---|---|---|---|
| JP | 57-193277 A | * | 11/1982 |
| JP | 1-104493 A | * | 4/1989 |
| JP | 1-205869 A | * | 8/1989 |
| JP | 2-92452 | | 4/1990 |
| JP | 2-247076 A | * | 10/1990 |
| JP | 4-37468 | | 2/1992 |
| JP | 4-37468 A | * | 2/1992 |
| JP | 4-48795 A | * | 2/1992 |
| JP | 04-174310 | | 6/1992 |
| JP | 4-237589 | | 8/1992 |
| JP | 4-237589 A | * | 8/1992 |
| JP | 5-13503 | | 1/1993 |
| JP | 05-245624 | | 9/1993 |
| JP | 5-277716 A | * | 10/1993 |
| JP | 06-125169 | | 5/1994 |
| JP | 6-344127 | | 12/1994 |
| JP | 9-232747 | | 9/1997 |
| JP | 11-204933 | | 7/1999 |
| JP | 2001-47221 A | * | 2/2001 |
| JP | 2001-47221 | | 2/2002 |
| JP | 4-253565 | | 9/2002 |

OTHER PUBLICATIONS

Form PCT/ISA/210 English translation.

* cited by examiner

LIGHT ENERGY PROCESSING DEVICE AND METHOD

THIS APPLICATION IS A U.S. NATIONAL PHASE APPLICATION OF PCT INTERNATIONAL APPLICATION PCT/JP02/10122.

TECHNICAL FIELD

The present invention relates to a machining apparatus using heat energy, a machining method, and production equipment using the machining apparatus.

BACKGROUND ART

A conventional machining apparatus includes a heating furnace (hereinafter referred to as "reflow furnace") where a workpiece is placed to be heated at a required temperature, and joints of the workpiece are, for example, soldered (hereinafter referred to as "reflow"). Alternatively, the soldering is performed by heat energy of a lamp light source or a laser beam source.

When workpieces including components having different heat resistances, different shapes, or different colors are placed in the reflow furnace for reflow, the component having low heat resistance burns and breaks or deforms. Such workpieces cannot be placed in the reflow furnace for reflow.

The reflow furnace requires a time to be heated up to an initial predetermined temperature, and if the workpiece requires a temperature change, it takes a time for adjustment for the temperature change inefficiently. Moreover, the furnace includes a heater requiring a large electricity, and the apparatus is large in size, thus requiring a large floor space. Further, a workpiece including a film-like or tape-like substrate cannot be cut by the reflow furnace, be marked, or be reformed at its surface.

In the case that a component having a low heat resistance is soldered by a lamp light source, a small heat energy requires a long time to set a temperature in the furnace to a temperature for soldering, and thus may cause the workpiece to melt or deform.

In the case that a component having a low heat resistance is soldered by a laser beam source, a large heat energy in a short time easily produces a defective having, for example, a solder ball or scattered solder.

It takes a time to move the light source, such as the lamp light source or the laser beam source, to each joint of the workpiece with a servomotor, and thus a high-speed soldering cannot be achieved.

SUMMARY OF THE INVENTION

A machining apparatus includes a light source for producing light energy, an optical system for guiding the produced light energy to a joint position of a workpiece, a table on which the workpiece is mounted, and a heating device provided at the table for heating the workpiece.

The machining apparatus, a machining method and production equipment using the machining apparatus enables the workpiece to be heated fast and locally, thus being applicable to soldering or the like.

DETAILED DESCRIPTION OF THE PREFERRED EMBODIMENTS (Exemplary Embodiment 1)

Figure 1:
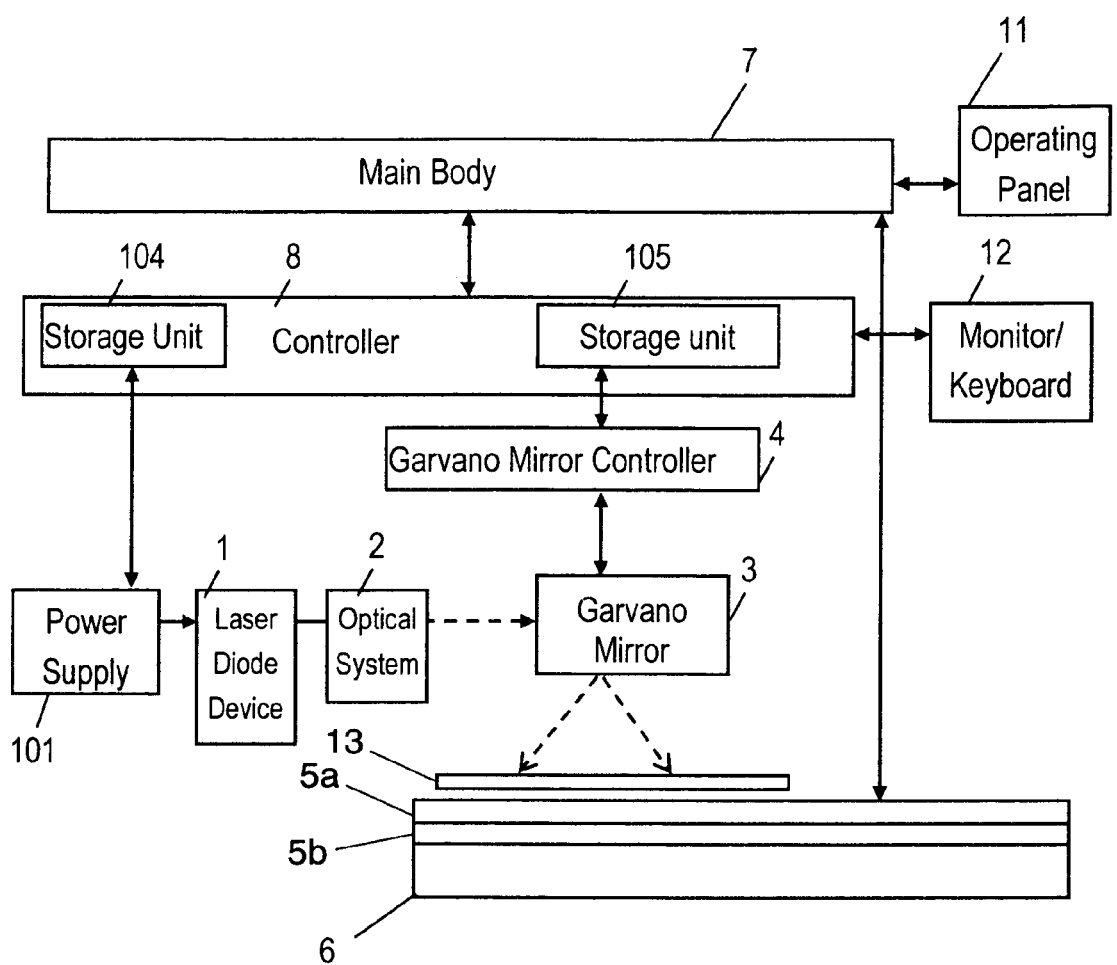
FIG. 1 is a schematic diagram of a machining apparatus in accordance with first and second exemplary embodiments of the present invention.

FIG. 1 is a schematic diagram of a machining apparatus in accordance with exemplary embodiment 1. Workpiece 13 includes a printed board with solder cream, which is joining material, applied thereto, and a surface-mounted component mounted on the printed board. In order to solder the surface-mounted component to the printed board, the machining apparatus includes light-energy power supply 101 and laser diode device 1 for applying light energy to have the solder melt, optical system 2 functioning as optical means for guiding the light energy to a joint position by applying spotlight, galvano-mirror controller 4 and galvano-mirror 3 for allowing the spotlight to scan a part to be melted at a high speed, and table 5a on which workpiece 13 is mounted. The machining apparatus further includes heating device 5b provided at table 5a for preheating workpiece 13 for improving machining quality and performance.

Workpiece 13 is mounted on table 5a and preheated by heating device 5b. Next, galvano-mirror controller 4 and galvano-mirror 3 allow the spotlight of the light energy, which is radiated from light-energy power supply 101 and laser diode device 1 through condenser 2, to scan the part of workpiece 13 that is to be melted for irradiation.

This configuration reduces solvent contained in the solder, so that even short-time radiation of light for joining does not cause the solvent to burst by expanding during vaporization. For this reason, high-quality soldering can be executed without scattering of a solder ball or the like. This high-speed local heating allows energy saving and suppresses thermal damage to the surface-mounted electronic component.

XY(Z) table 6 functioning as means for moving an irradiation position and provided at table 5a can move workpiece 13 in an XY(Z) direction, thereby increasing a scanning area.

Further, an adjuster for changing an irradiation area of the light energy applied to the joint position, such as a focal length adjusting unit, a fiber, an irradiation angle or a mask (not shown), allows irradiation adapted to the shape or use of the workpiece, such as irradiation with the light in the form of large/small spot, a line, or a boarder of a square.

Light-energy power supply 101 may employ a laser-diode (LD) power supply. Optical system 2 may employ a condenser. Heating device 5b may employ a heating device. XY(Z) table 6 may be driven by a servomotor.

(Exemplary Embodiment 2)

In FIG. 1, controller 8 reads a machining condition corresponding to a machining position of workpiece 13 from a machining condition storage unit 104 and provides the machining condition to light-energy power supply 101, which in turn controls laser diode device 1 for generating a specified energy. The light is condensed by optical system 2, is reflected by galvano-mirror 3 and is then applied to workpiece 13. Simultaneously, machining position storage unit 105 supplies information about a heating position to galvano-mirror controller 4, and thereby galvano-mirror 3 can guide an incident light to the heating position. Heating device 5b preheats workpiece 13 based on information from machining condition storage unit 104.

A personal computer, a sequencer or the like may be used for machining condition storage unit 104 and machining position storage unit 105.

(Exemplary Embodiment 3)

Figure 2:
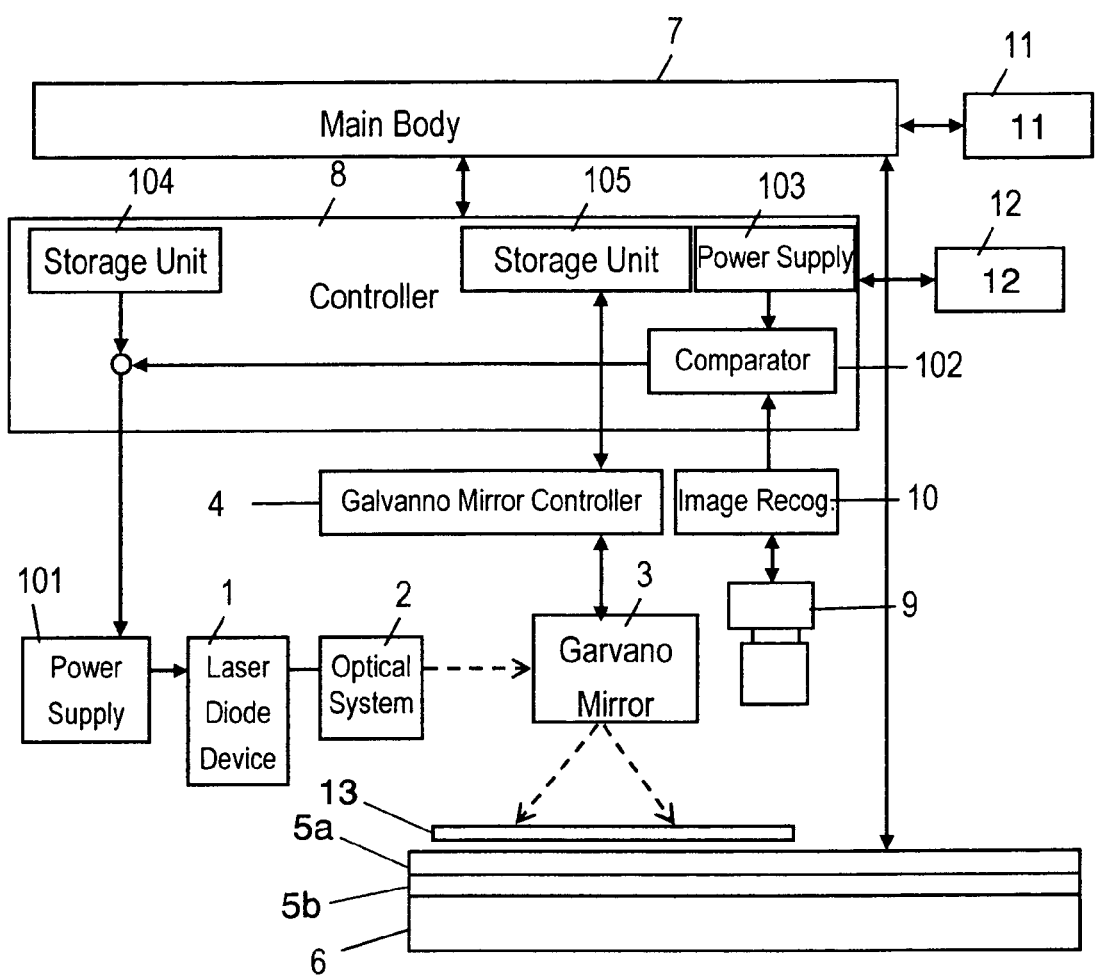
FIG. 2 is a schematic diagram of a machining apparatus in accordance with a third exemplary embodiment of the invention.

In FIG. 2, controller 8 reads a machining condition corresponding to a current machining position from machining condition storage unit 104 and supplies the machining condition to light-energy power supply 101 in order to machine workpiece 13. Simultaneously, camera 9 captures a machining status, and thus, image recognition device 10 recognizes a machining result. Comparator 102 compares the machining result recognized with information about proper machining that is stored in machining status storage unit 103, and then, machining condition storage unit 104 receives feedback from comparator 102. The machining condition is corrected based on the information fed back and is supplied to light-energy power supply 101 for soldering or the like.

(Exemplary Embodiment 4)

Figure 3:
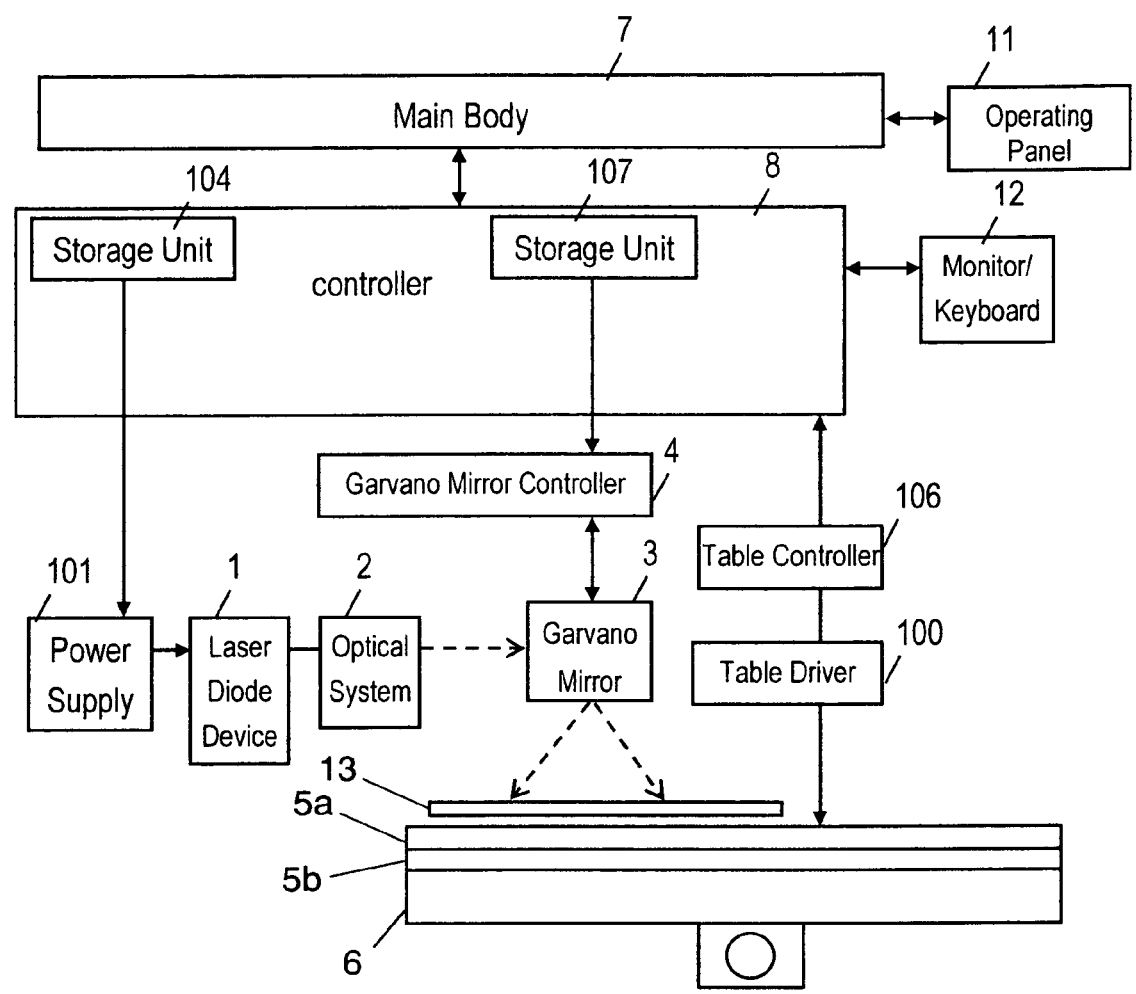
FIG. 3 is a schematic diagram of a machining apparatus in accordance with a fourth exemplary embodiment of the invention.

FIG. 3 is a schematic diagram of a machining apparatus in accordance with exemplary embodiment 4. Controller 8 reads a machining condition corresponding to a machining position of workpiece 13 from machining condition storage unit 104 and supplies the machining condition to light-energy power supply 101, which in turn controls laser diode device 1 for generating a specified energy. The light is condensed by optical system 2, is reflected by galvano-mirror 3, and is then applied to workpiece 13. Simultaneously, machining position storage unit 105 supplies information about a heating position to galvano-mirror controller 4, and thereby, galvano-mirror 3 can guide an incident light to the heating position of workpiece 13. Heating device 5b can shorten machining time. If the machining position is located out of a scanning range of galvano-mirror 3, controller 8 supplies positional information to table controller 106, and thereby table driver 100 moves table 6 so that the machining position is located within the scanning range of galvano-mirror 3.

(Exemplary Embodiment 5)

Figure 4:
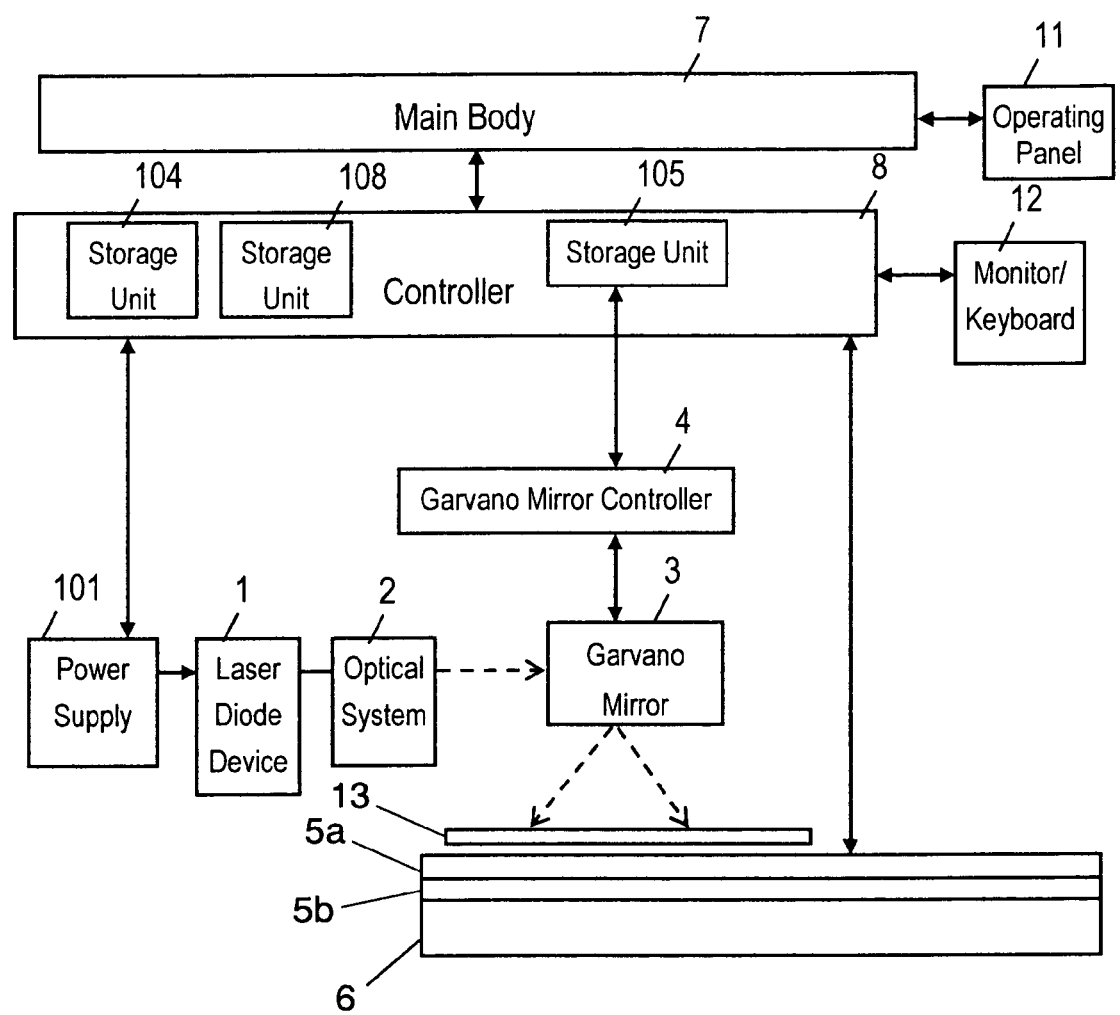
FIG. 4 is a schematic diagram of a machining apparatus in accordance with a fifth exemplary embodiment of the invention.

FIG. 4 is a schematic diagram of a machining apparatus in accordance with exemplary embodiment 5. Controller 8 reads a machining condition corresponding to a current machining position of workpiece 13 from machining condition storage unit 104 and supplies the machining condition to light-energy power supply 101, which in turn controls laser diode device 1 for generating a specified energy. The light is condensed by optical system 2, is reflected by galvano-mirror 3, and is then applied to workpiece 13. Simultaneously, machining position storage unit 105 supplies information about a heating position to galvano-mirror controller 4, and thereby galvano-mirror 3 can guide an incident light to the heating position of workpiece 13. Heating device 5b preheats workpiece 13 based on information from machining condition storage unit 104.

Controller 8 further reads a cutting condition corresponding to a cutting position on workpiece 13 from cutting condition storage unit 108 and supplies the cutting condition to light-energy power supply 101, which in turn controls laser diode device 1 for generating a specified energy. The light is condensed by optical system 2, is reflected by galvano-mirror 3, and is then applied to workpiece 13. Simultaneously, machining position storage unit 105 supplies the information about the heating position to galvano-mirror controller 4, and thereby, galvano-mirror 3 can guide an incident light to the heating position. In this manner, film-like or tape-like workpiece 13 is cut.

(Exemplary Embodiment 6)

Figure 5:
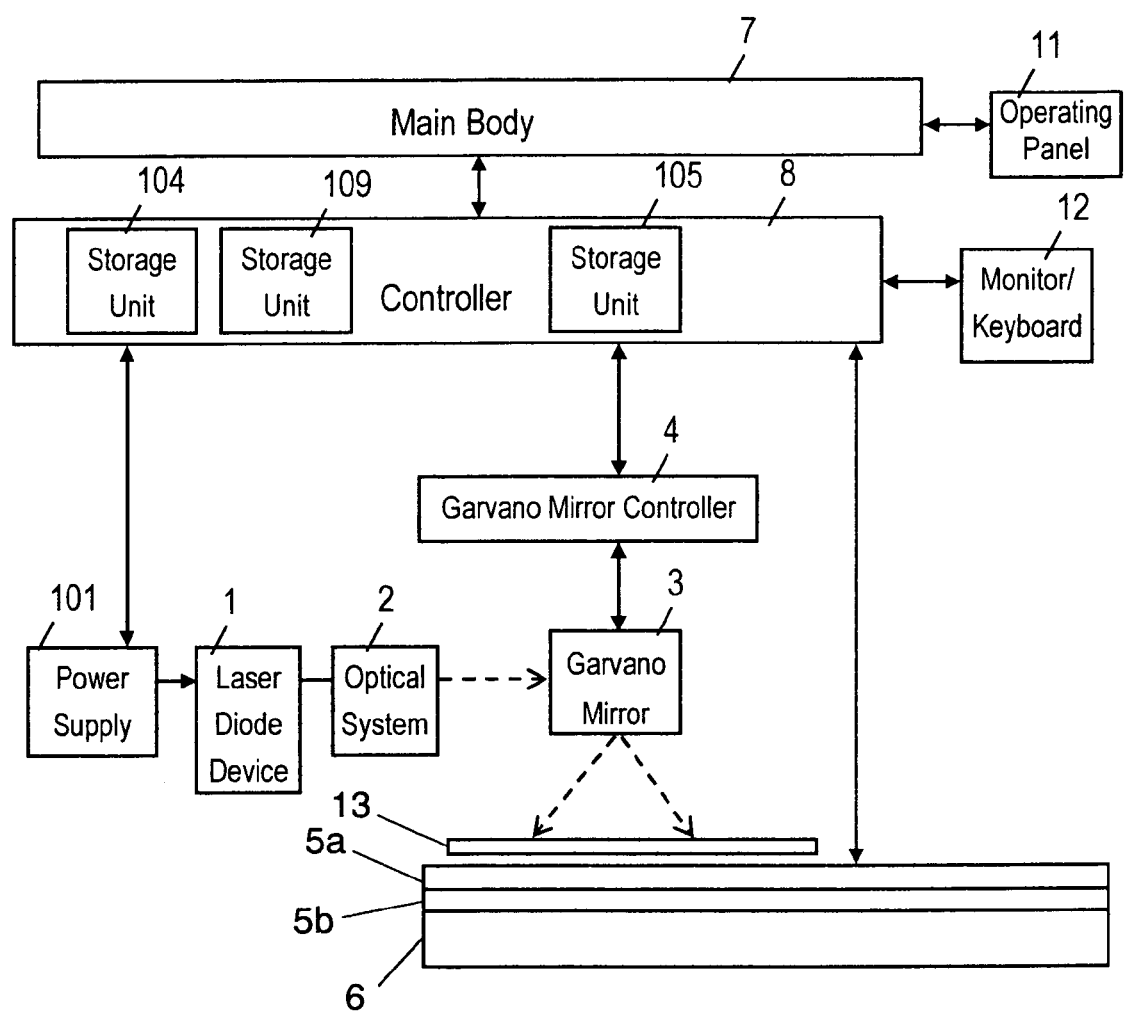
FIG. 5 is a schematic diagram of a machining apparatus in accordance with a sixth exemplary embodiment of the invention.

FIG. 5 is a schematic diagram a machining apparatus in accordance with exemplary embodiment 6. Controller 8 reads a machining condition corresponding to a machining position of workpiece 13 from machining condition storage unit 104 and supplies the machining condition to light-energy power supply 101, which in turn controls laser diode device 1 for generating a specified energy. The light is condensed by optical system 2, is reflected by galvano-mirror 3, and is then applied to workpiece 13. Simultaneously, machining position storage unit 105 supplies information about a heating position to galvano-mirror controller 4, and thereby, galvano-mirror 3 can guide an incident light to the heating position of workpiece 13. Heating device 5b preheats workpiece 13 based on information from machining condition storage unit 104.

Controller 8 further reads a marking condition corresponding to the current machining position from marking condition storage unit 109 and supplies the marking condition to light-energy power supply 101, which in turn controls laser diode device 1 for generating a specified energy. The light is condensed by optical system 2, is reflected by galvano-mirror 3, and is then applied to workpiece 13. Simultaneously, machining position storage unit 105 supplies the information about the heating position to galvano-mirror controller 4, and thereby galvano-mirror 3 can guide an incident light to the heating position. Workpiece 13 is thus marked by the light energy. The marking may be a workpiece number, a machining result, a manufacturing date or the like.

(Exemplary Embodiment 7)

Figure 6:
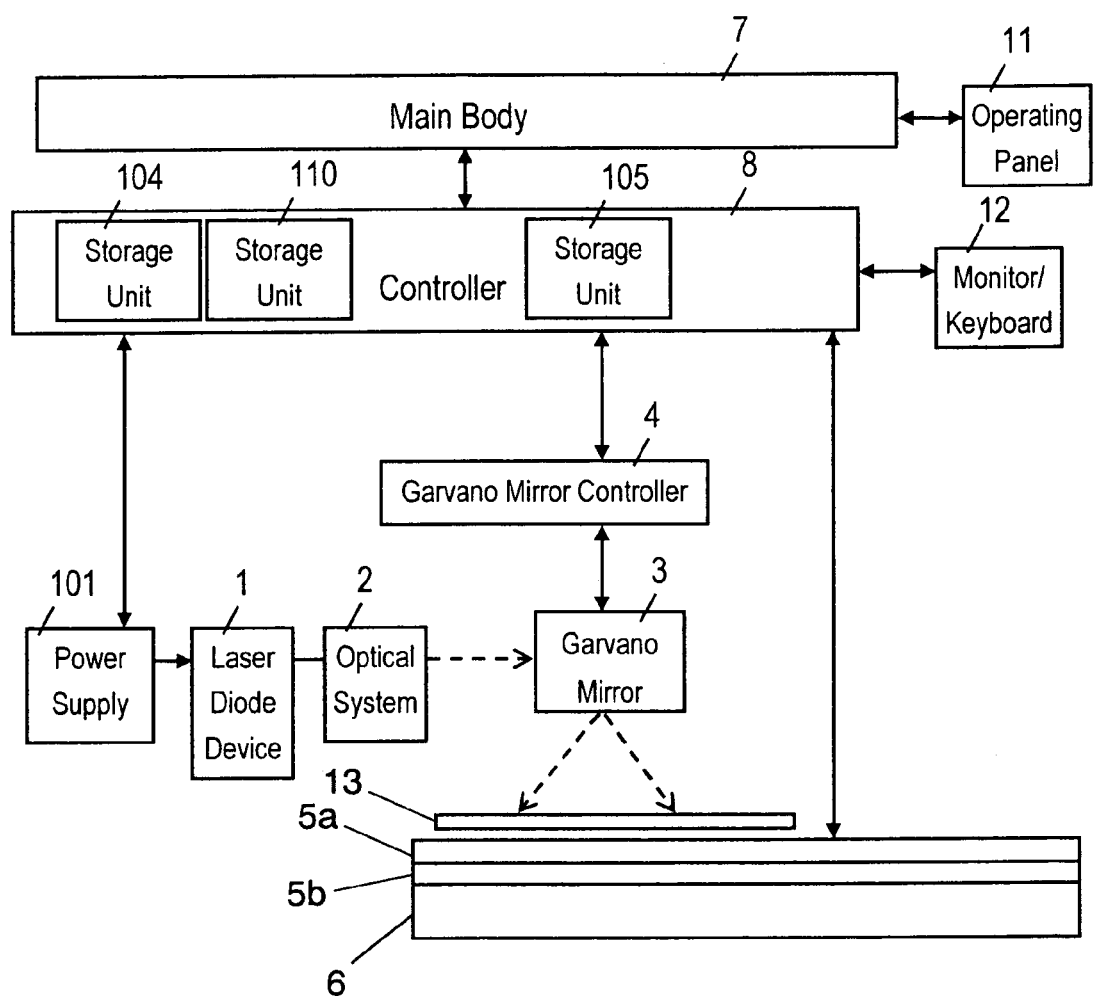
FIG. 6 is a schematic diagram of a machining apparatus in accordance with a seventh exemplary embodiment of the invention.

FIG. 6 is a schematic diagram of a machining apparatus in accordance with exemplary embodiment 7. Controller 8 reads a machining condition corresponding to a machining position of workpiece 13 from machining condition storage unit 104 and supplies the machining condition to light-energy power supply 101, which in turn controls laser diode device 1 for generating a specified energy. The light is condensed by optical system 2, is reflected by galvano-mirror 3, and is then applied to workpiece 13. Simultaneously, machining position storage unit 105 supplies information about a heating position galvano-mirror controller 4, and thereby galvano-mirror 3 can guide an incident light to the heating position of workpiece 13. Heating device 5b preheats the workpiece based on information from machining condition storage unit 104.

Controller 8 reads a surface reforming condition corresponding to the current machining position of the workpiece from surface reforming condition storage unit 110 and supplies the surface reforming condition to light-energy power supply 101, which in turn controls laser diode device 1 for generating a specified energy. The light is condensed by optical system 2, is reflected by galvano-mirror 3, and is then applied to workpiece 13. Simultaneously, machining position storage unit 105 supplies the information about the heating position to galvano-mirror controller 4, and thereby galvano-mirror 3 can guide an incident light to the surface reforming position of workpiece 13. In this manner, the surface of workpiece 13 is reformed.

(Exemplary Embodiment 8)

Figure 7:
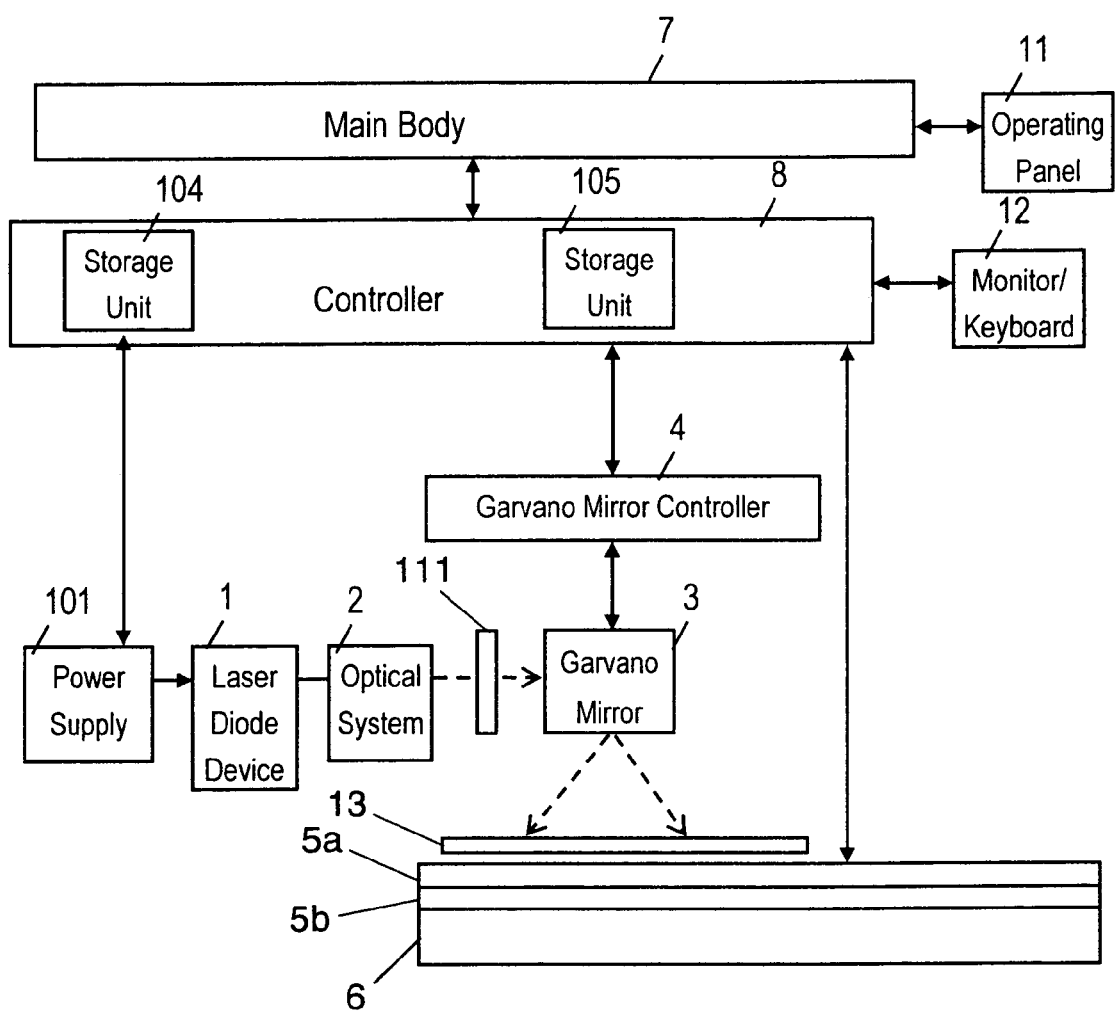
FIG. 7 is a schematic diagram of a machining apparatus in accordance with an eighth exemplary embodiment of the invention.

FIG. 7 is a schematic diagram of a machining apparatus in accordance with exemplary embodiment 8. Controller 8 reads a machining condition corresponding to a machining position of workpiece 13 from machining condition storage unit 104 and supplies the machining condition to light-energy power supply 101, which in turn controls laser diode device 1 for generating a specified energy. Aperture 111 permits only light having its unnecessary energy eliminated to pass. The light condensed by optical system 2 is reflected by galvano-mirror 3 and is then applied to workpiece 13. Simultaneously, machining position storage unit 105 supplies information about a heating position to galvano-mirror controller 4, and thereby galvano-mirror 3 can guide an incident light to the heating position of workpiece 13. Heating device 5b preheats workpiece 13 based on information from machining condition storage unit 104. In this manner, high-quality soldering can be performed on workpiece 13.

(Exemplary Embodiment 9)

Figure 8:
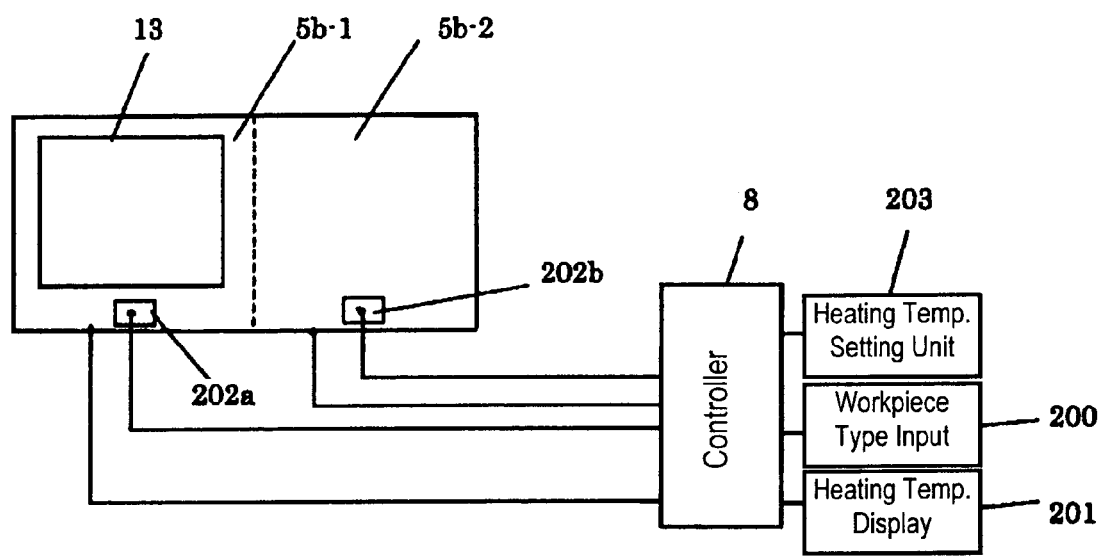
FIG. 8 illustrates the layout of a heating device of a machining apparatus in accordance with a ninth exemplary embodiment of the invention.

Referring to FIG. 8, exemplary embodiment 9 of this invention will be described. In FIG. 8, heating temperature setting unit 203 sets a temperature for preheating workpiece 13, thereby heating devices 5b-1 and 5b-2 are heated. Temperature sensors 202a and 202b detects respective temperatures of heating devices 5b-1 and 5b-2. When the temperature of heating devices 5b-1 and 5b-2 changes from the preheating temperature set, controller 8 receives feedback to maintain the temperature of heating devices 5b-1 and 5b-2 at the set temperature. The temperatures of heating devices 5b-1 and 5b-2 may be displayed on heating temperature display 201.

The type of the workpiece is input to workpiece type input unit 200, and heating devices 5b-1 and 5b-2 are switched according to the type of the workpiece for soldering, thus allowing power saving.

Workpiece type input unit 200 may be implemented by a keyboard and a touch panel, and heating temperature display 201 may be implemented by the touch panel and a CRT.

(Exemplary Embodiment 10)

Figure 9:
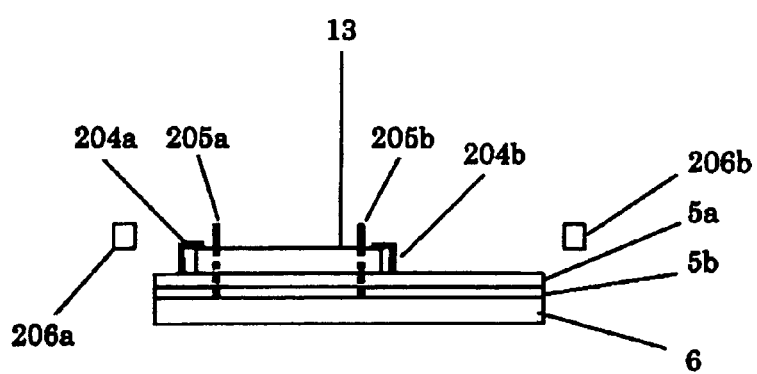
FIG. 9 illustrates positioning of a workpiece in a machining apparatus in accordance with a tenth exemplary embodiment of the invention.

Exemplary embodiment 10 of the present invention will be described with reference to FIG. 9. In FIG. 9, workpiece fixing units 204a and 204b and workpiece positioning unit 205a and 205b are mounted to heating device 5b or table 5a to fix and position workpiece 13. Workpiece 13 may be fixed from behind by suction by a vacuum suction pad (not shown).

Float detectors 206a and 206b determine whether or not workpiece 13 is fixed and positioned properly without floating. Soldering is performed after it is confirmed that workpiece 13 is properly fixed, i.e., does not float. In this manner, high-quality machining can be performed for workpiece 13.

(Exemplary Embodiment 11)

Figure 10:
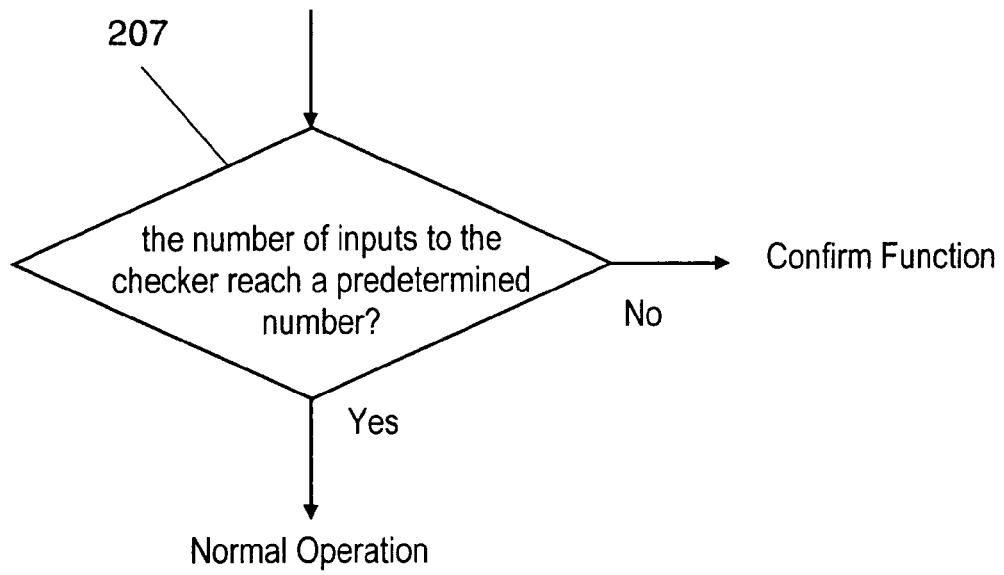
FIG. 10 is a flowchart for checking a function of a machining apparatus in accordance with an eleventh exemplary embodiment of the invention.

Exemplary embodiment 11 of the invention will be described with reference to FIG. 10. In FIG. 10, periodic function checker 207 determines that the number of inputs to the checker reach a predetermined number, and then automatically checks respective functions of optical system 2, galvano-mirror 3, galvano-mirror controller 4, light-energy power supply 101, laser diode device 1. When the functions are not proper in comparison with a predetermined range, the checker outputs an indication of abnormality. The predetermined range is adjusted so that an operator receives a proper warning, and thus the apparatus can be maintained early.

(Exemplary Embodiment 12)

Figure 11:
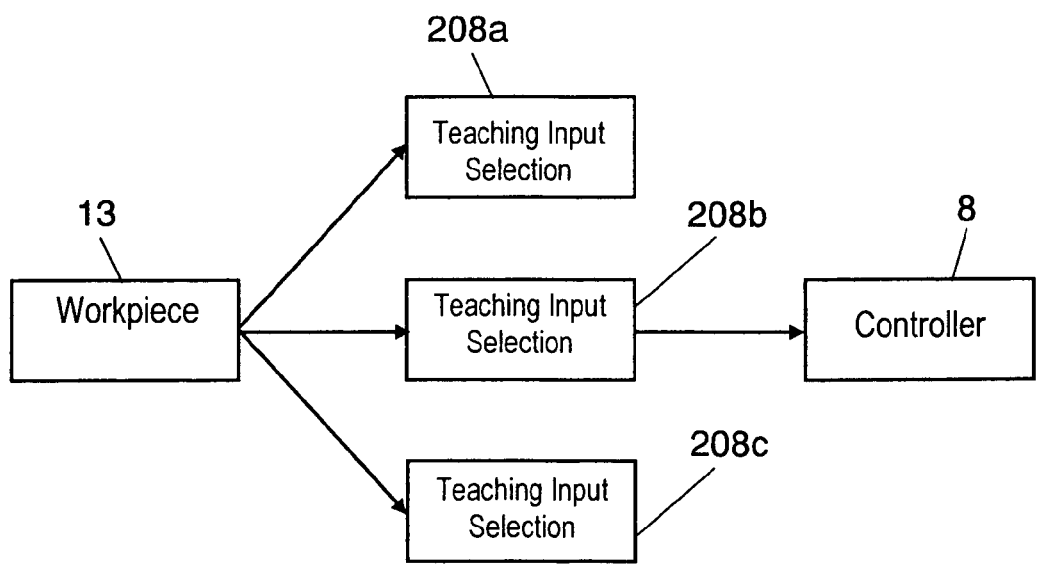
FIG. 11 illustrates a teaching input selector of a machining apparatus in accordance with a twelfth exemplary embodiment of the invention.

Referring to FIG. 11, exemplary embodiment 12 of the preset invention will be described. As shown in FIG. 11, data of a joint position of workpiece 13 is stored in controller 8 through a way selected from teaching-input selections 208a, 208b, and 208c.

Thus, a teaching input can be performed according to the type of workpiece 13 by the way selected by a user. Teaching-input selections 208a, 208b, and 208c may be implemented by an image recognition device, such as a camera or a scanner, CAD data, and a CAD program.

(Exemplary Embodiment 13)

Referring to FIGS. 12 to 30, exemplary embodiment 10 of the invention will be described. In a preheating performed by controlling heating device 5b shown in FIG. 12, hygroscopic component of solder cream 159 is removed as shown in FIGS. 22A and 22B, and a removal of an oxide film is facilitated by melting flux. A preheating temperature is set lower than and close to a boiling point of solvent included in the flux contained in solder cream 159, so that the solvent can be vaporized and reduced in a short time.

Since the preheating lasts a short time, oxidation of solder component of the solder during the preheating time is negligible. Thus, the solvent does not burst by expanding during vaporization even when only a joint is heated quickly by light energy. For this reason, high-quality soldering without scattering of a solder ball or the like can be performed.

(Exemplary Embodiment 14)

Exemplary embodiment 14 of the invention will be described with reference to FIGS. 12 and 13.

Figure 12:
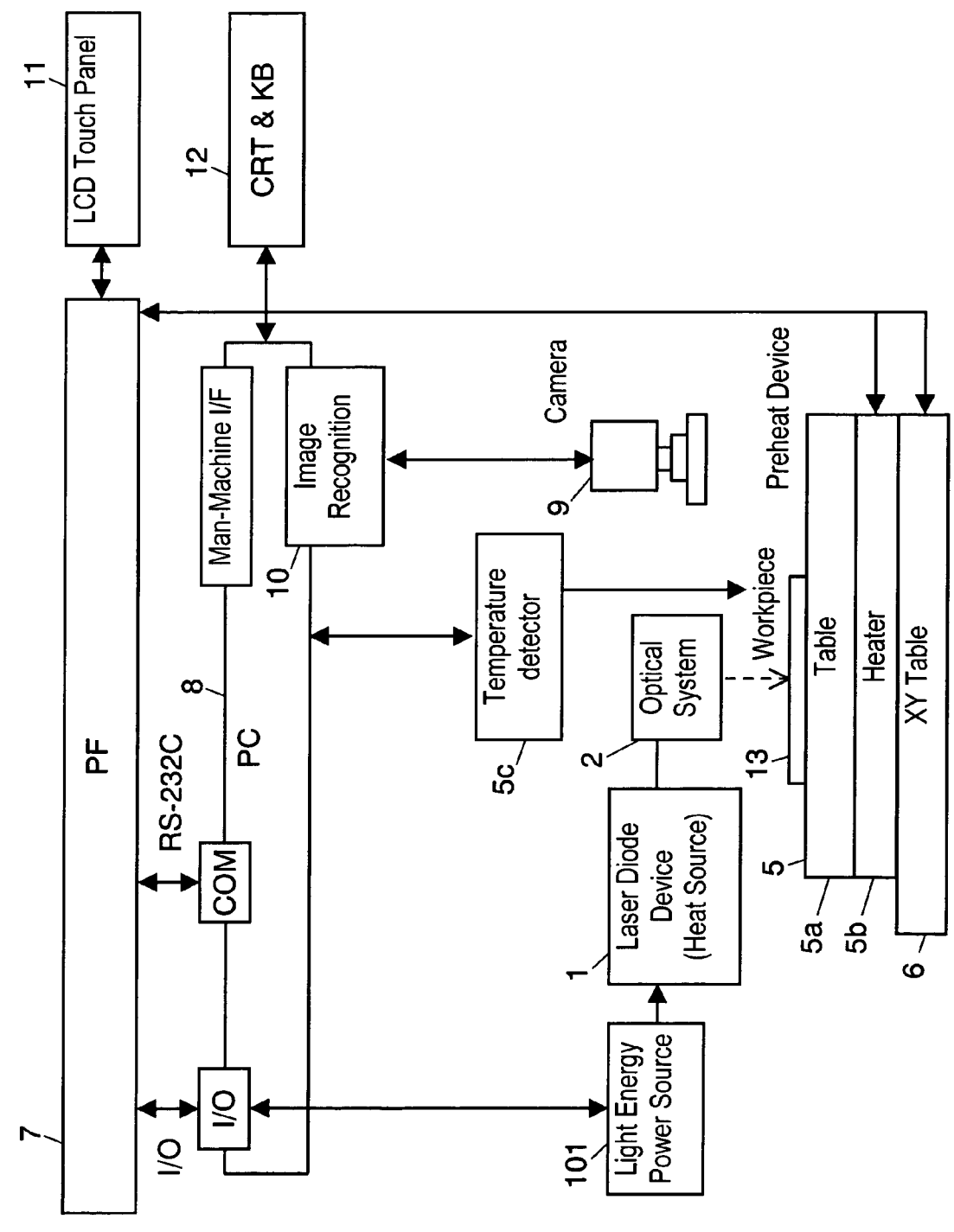
FIG. 12 is a schematic diagram of a machining apparatus in accordance with thirteenth and fourteenth exemplary embodiments of the invention.

In FIG. 12, temperature sensor 5c detects a temperature of workpiece 13. Temperature sensor 5c may be implemented by a non-contact thermometer.

Figure 13:
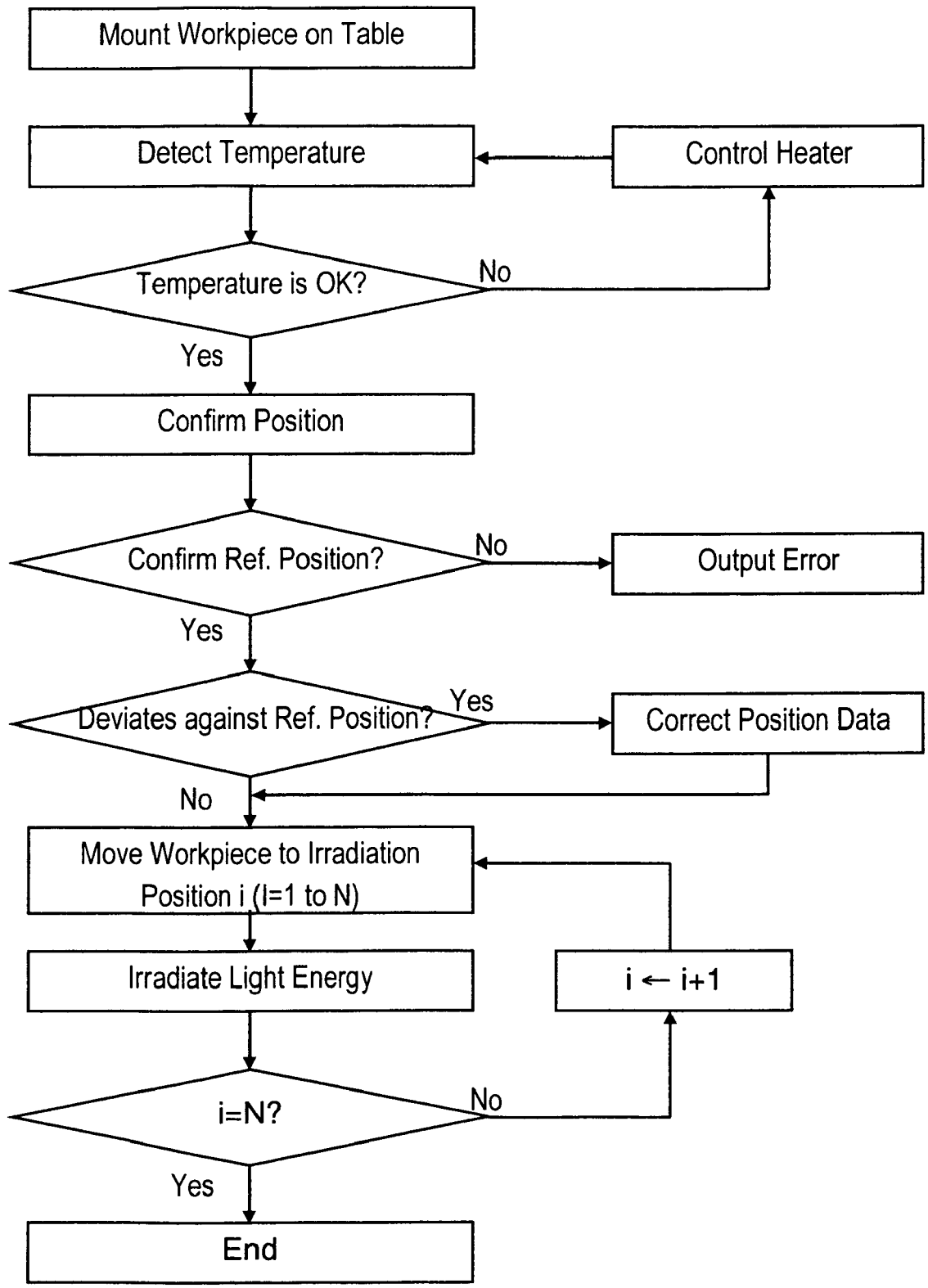
FIG. 13 is a flowchart of a machining method in accordance with the fourteenth embodiment.

FIGS. 12 and 13 illustrate a machining apparatus and a flowchart of a machining method in accordance with the present embodiment. First, workpiece 13 including a substrate having solder cream applied thereto and a component mounted thereto is placed on table 5a. Since heating device 5b heats table 5a, workpiece 13 starts to be preheated soon after being placed on the table.

Next, temperature sensor 5c determines whether or not the temperature of workpiece 13 is equal to a temperature set lower than and close to a boiling point of solvent included in flux contained in solder cream 159 and is lower than an increased temperature which will be achieved by light energy for joining. If the detected temperature is out of an acceptable range, heating device 5b is controlled so as to make the temperature of workpiece 13 be within the acceptable range.

After the detected temperature is determined to be in the acceptable range, camera 9, image recognition device 10, and personal computer (PC) 8 identify a reference position. If the reference position cannot be identified, an error is output to stop machining. If the reference position is identified, it is determined whether or not the reference position is deviated from a given taught position. If a deviation is detected, PC 8 corrects whole data of irradiation positions according to the deviation.

According to the corrected data, XY(Z) table 6 moves workpiece 13 to a first irradiation position. After irradiation of a predetermined light energy for a predetermined time, workpiece 13 is moved to a second irradiation position. The moving of workpiece 13 and the irradiation with the light energy are thus repeated until an N-th irradiation position (where N is the total number of irradiation positions) is reached. Machining of workpiece 13 terminates when as irradiation in the N-th position is completed.

The preheating performed by heating device 5b removes hygroscopic component from solder cream 159 and facilitates removal of an oxide film caused by melting the flux. A preheating temperature is set lower than and close to the boiling point of solvent included in the flux contained in solder cream 159, so that the solvent can be vaporized and reduced in a short time.

Since the preheating lasts for a short time, oxidation of solder component of the solder during the preheating time is negligible. Thus, the solvent does not burst by expanding during vaporization even when only a joint is heated quickly by the light energy. For this reason, high-quality soldering without scattering of a solder ball can be performed.

It is noted that temperature sensor 5c is not necessarily required. Even if the temperature is not detected, the similar machining can be performed by control of a setting temperature of heating device 5b and the preheating time that are determined by a preliminary experiment.

(Exemplary Embodiment 15)

Figure 14:
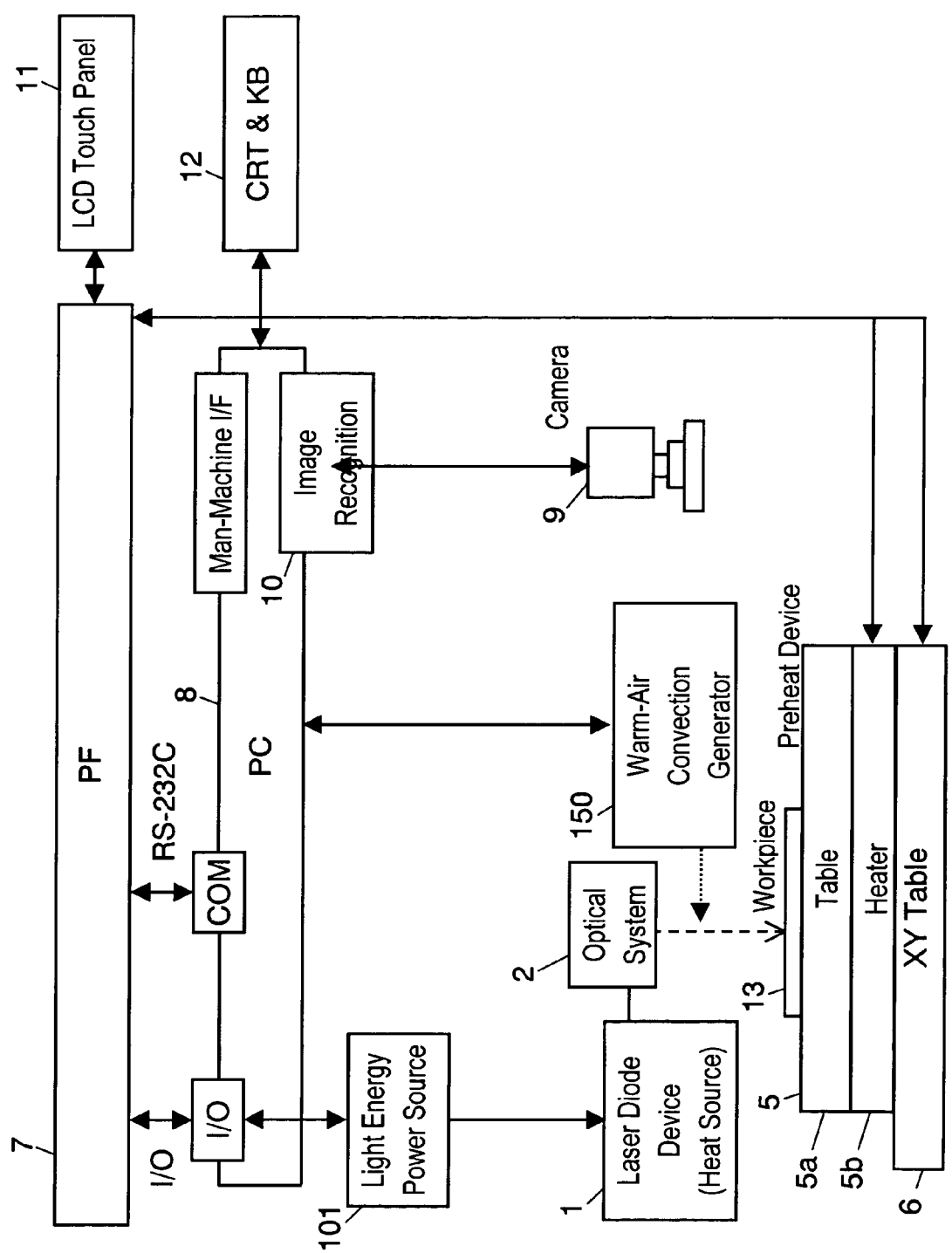
FIG. 14 is a schematic diagram of a machining apparatus in accordance with a fifteenth exemplary embodiment of the invention.
Figure 15:
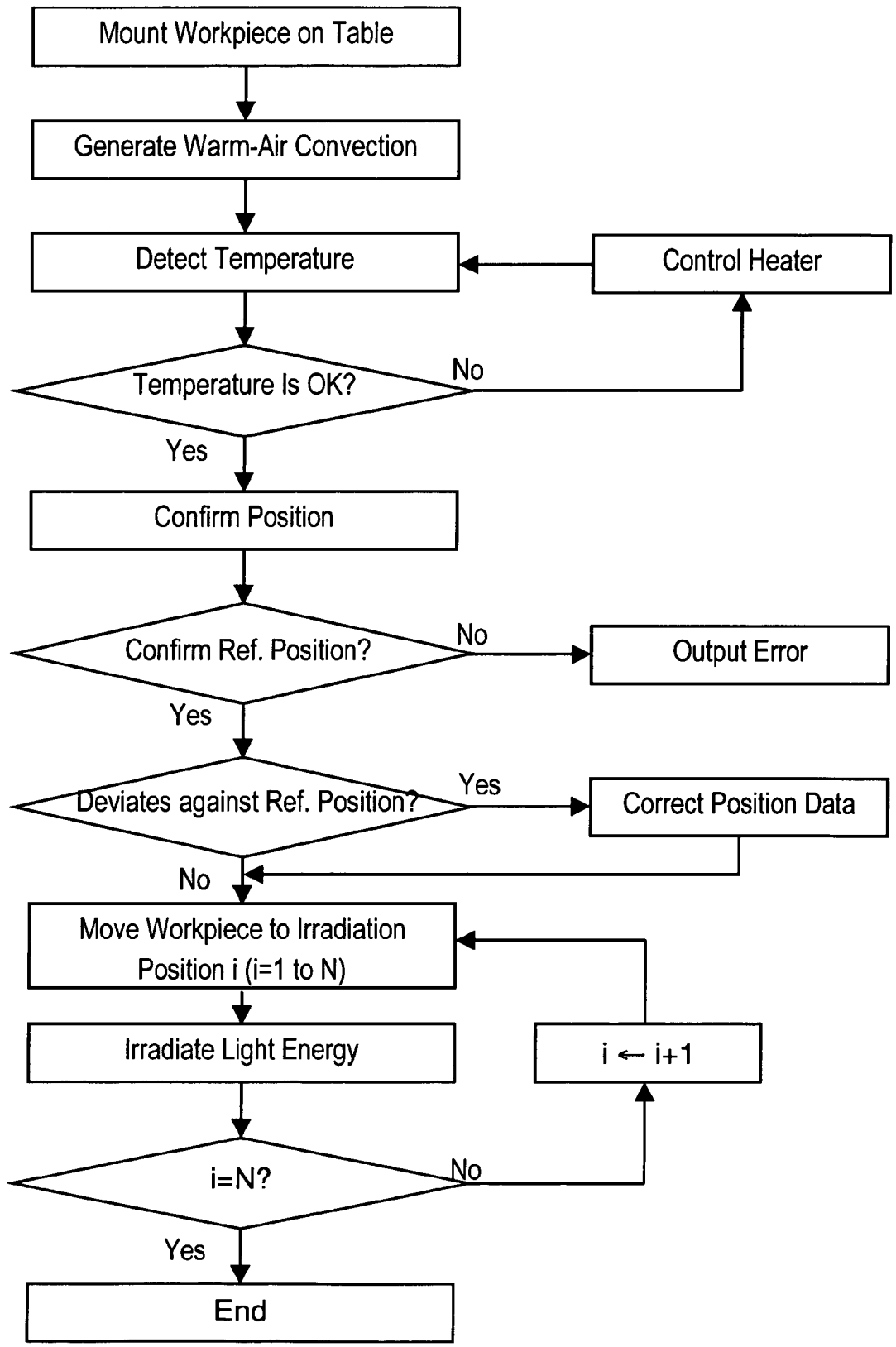
FIG. 15 is a flowchart of a machining method in accordance with the fifteenth embodiment.

Referring to FIGS. 14 and 15, exemplary embodiment 15 of the invention will be described. In FIG. 14, instead of temperature sensor 5c shown in FIG. 12, warm-air convection generator 150 is connected to PC 8.

FIGS. 14 and 15 illustrate a machining apparatus and a flowchart of a machining method in accordance with the present embodiment. First, solder cream 159 is applied to substrate 160, and component 158 is mounted on substrate 160, as shown in FIG. 22. When workpiece 13 is placed on table 5a, warm-air convection generator 150 blows warm air above workpiece 13, as shown in FIGS. 14 and 15. Since heating device 5b heats table 5a, workpiece 13 is preheated when being placed.

After a lapse of a predetermined time (preheating time), camera 9, image recognition device 10, and PC 8 identify a reference position. If the reference position cannot be identified, an error is output to stop machining. If the reference position is identified, PC 8 determines the amount of deviation between the reference position and a given taught position, and corrects whole data of irradiation positions.

According to the corrected data, XY(Z) table 6 moves workpiece 13 to a first irradiation position. After irradiation of a predetermined light energy for a predetermined time, workpiece 13 is moved to a second irradiation position. The moving of workpiece 13 and the irradiation of the light energy are thus repeated until an Nth irradiation position (where N is the total number of irradiation positions) is reached. Machining of workpiece 13 terminates when the irradiation for the N-th position is completed.

The preheating performed by heating device 5b and the heating performed by warm-air convection generator 150 remove hygroscopic component from solder cream 159 and facilitate removal of an oxide film caused by melting flux. Moreover, solvent contained in the solder cream can be vaporized and reduced in a short time. Further, the convection generated above workpiece 13 by warm-air convection generator 150 prevents the evaporated solvent from remaining above workpiece 13.

Since the preheating lasts for a short time, oxidation of solder component of the solder during the preheating time is negligible. Thus, the solvent does not burst by expanding during vaporization even when only a joint is heated quickly by the light energy. For this reason, high-quality soldering without scattering of a solder ball can be performed.

(Exemplary Embodiment 16)

Figure 16:
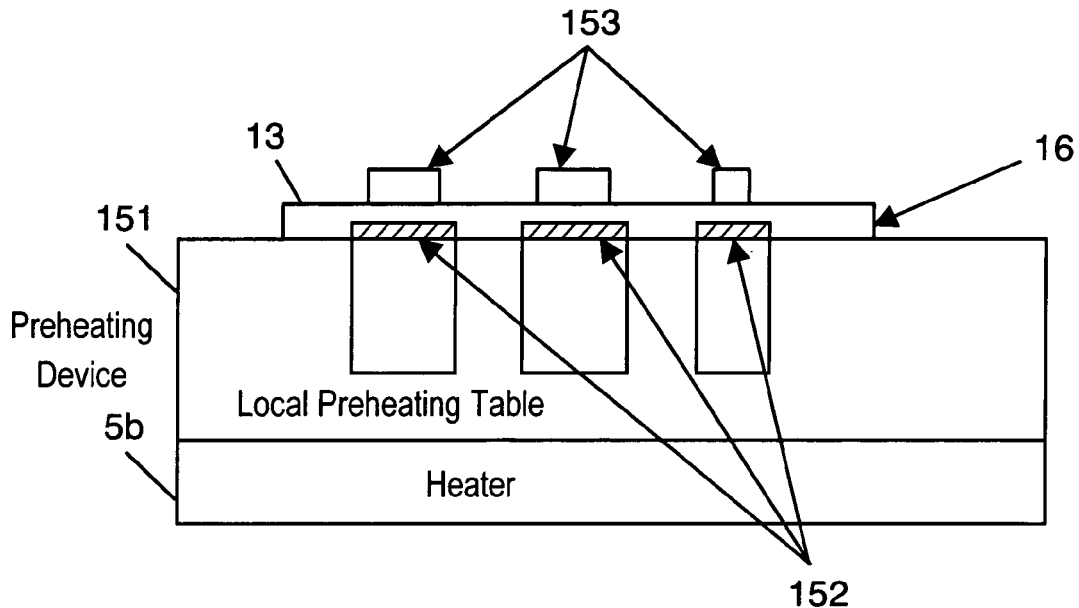
FIG. 16 is an enlarged view of a local heating table in accordance with a sixteenth exemplary embodiment of the invention.

FIG. 16 is an enlarged view of local-preheating 151, which partially heats a workpiece in a machining apparatus in accordance with exemplary embodiment 16. As shown in FIG. 12, a partial non-contact part 152 which does not contact is provided between workpiece 13 and local preheating table 151, and is hardly heated. For example, if bare IC chip 153 is already mounted on substrate 160 of workpiece 13 in another process, the quality of bare IC chips 153 may decline when its temperature is raised. Non-contact part 152 prevents such a component from being preheated.

Thus, high-quality soldering with light energy only for a necessary position without scattering of a solder ball is performed even when, for example, bare IC chip 153, which has a quality declining according to its temperature rise, is already mounted on substrate 160 of workpiece 13 in another process.

(Exemplary Embodiment 17)

Figure 17:
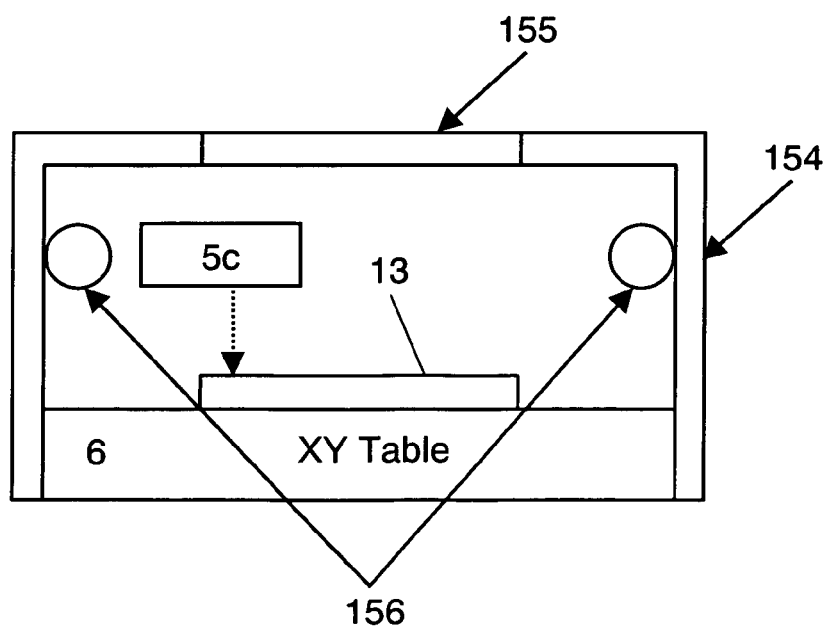
FIG. 17 is an enlarged view of an overall heating device in accordance with a seventeenth exemplary embodiment of this invention.

FIG. 17 is an enlarged view of overall-heating device 154 which entirely heats a workpiece in a machining apparatus in accordance with exemplary embodiment 17. As shown in FIG. 13, overall heating device 154 covers a workpiece and includes glass 155 provided at its upper portion which permits a light energy to pass, and lamps 156 provided at its both sides which function as heat sources. Overall heating device 154 is mounted to XY(Z) table 6 and is hence movable. Lamps 156 are controlled to be turned on and off so that the temperature of workpiece 13 detected by the temperature sensor 5c is maintained at a predetermined temperature. In this way, workpiece 13 is entirely heated, so that high-speed and uniform preheating can be performed, and the light energy allows short-time and high-quality soldering without scattering of a solder ball.

(Exemplary Embodiment 18)

Figure 18:
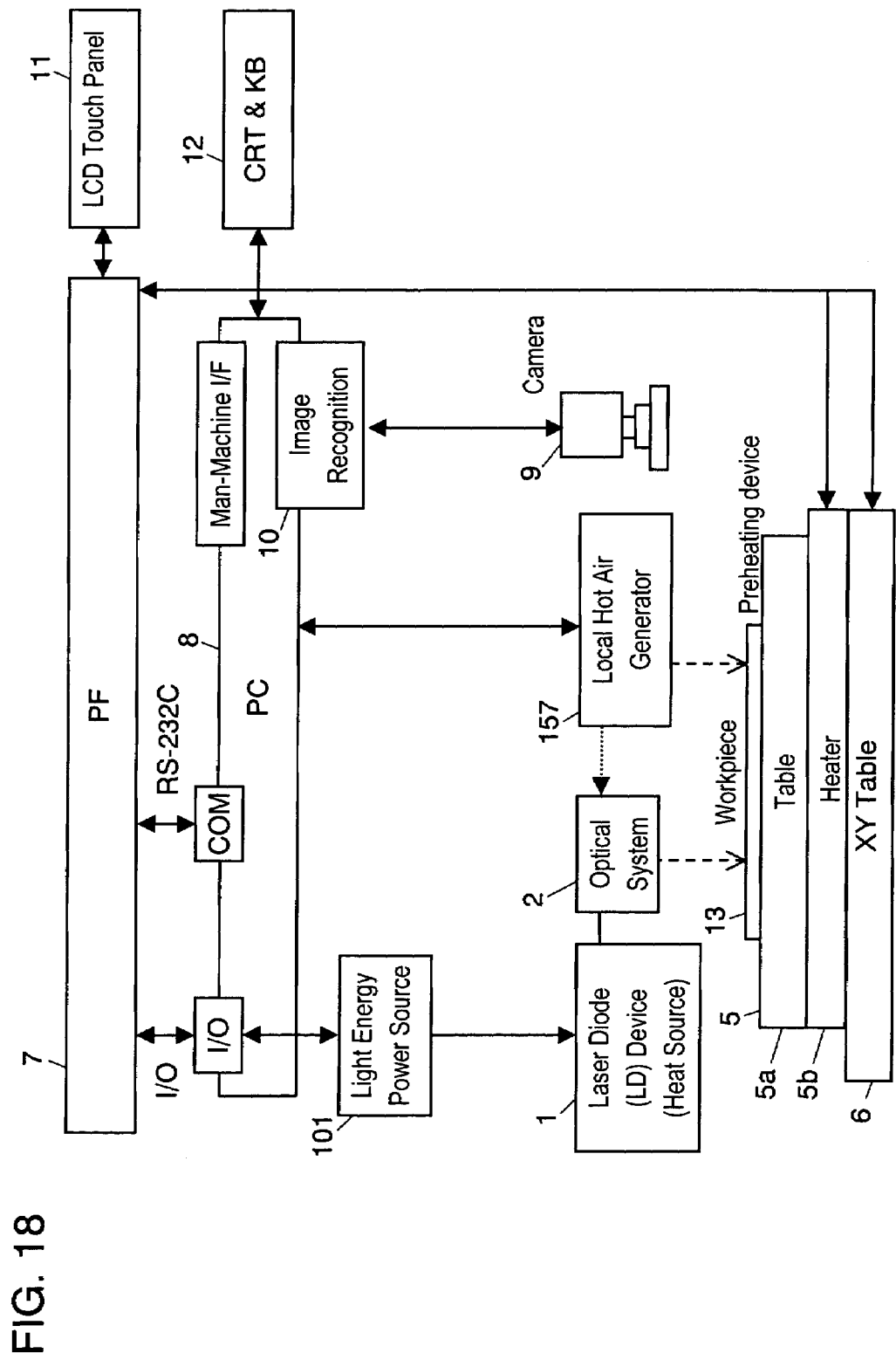
FIG. 18 is a schematic diagram of a machining apparatus in accordance with an eighteenth exemplary embodiment of the invention.
Figure 19:
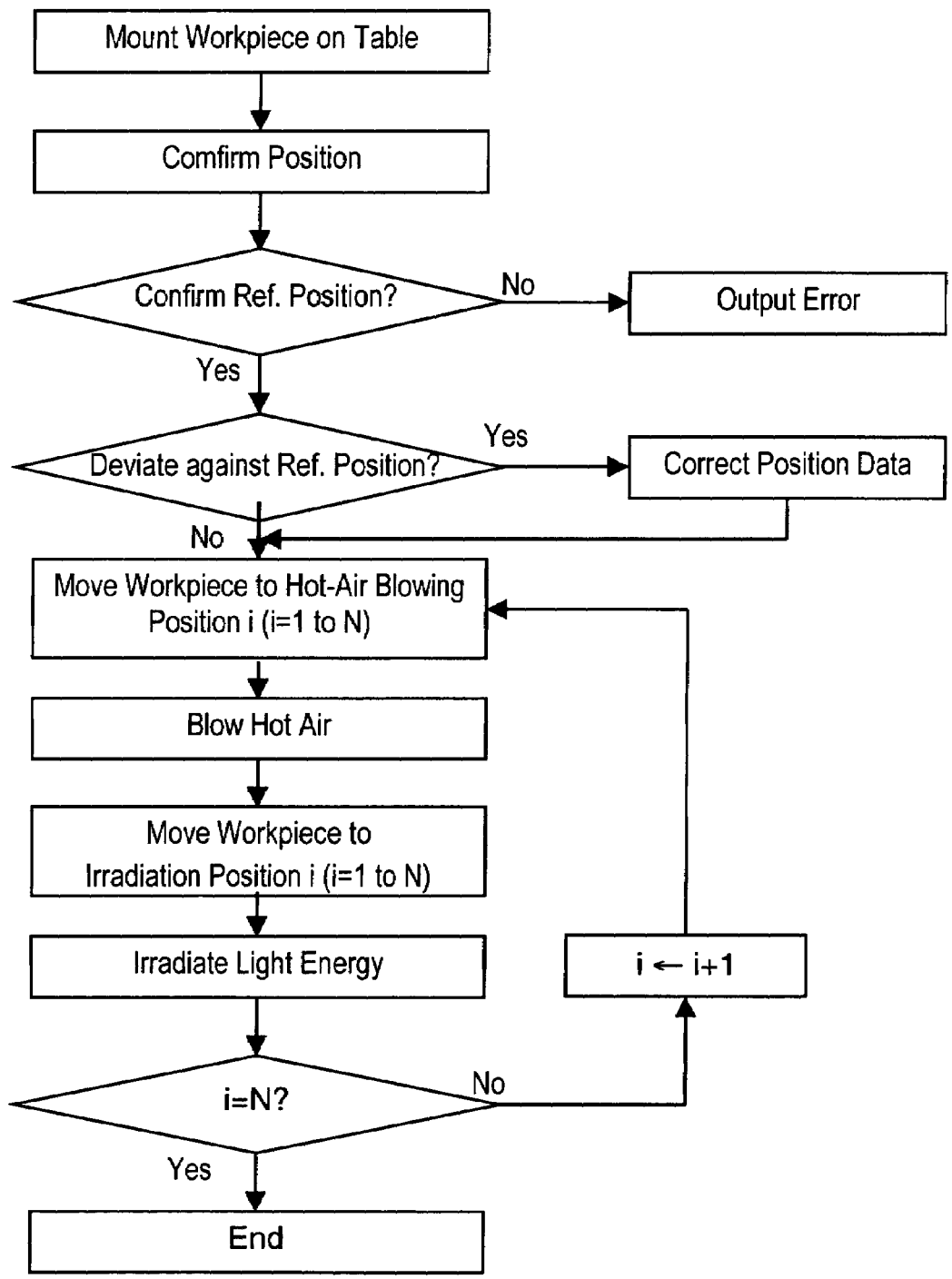
FIG. 19 is a flow chart of a machining method in accordance with the eighteenth embodiment.

Referring to FIGS. 18 and 19, exemplary embodiment 18 of the present invention will be described. In FIG. 18, instead of temperature sensor 5c used in a machining apparatus of FIG. 12, local-hot-air generator 157 is used together with a condenser.

FIGS. 18 and 19 illustrate a machining apparatus and a flowchart of a machining method in accordance with the present embodiment. First, solder cream 159 is applied to substrate 160, and component 158 is mounted on substrate 160, as shown in FIG. 22. Then, workpiece 13 is placed on table 5a, as shown in FIGS. 14 and 15. Next, camera 9, image recognition device 10, and PC 8 identify a reference position. If the reference position cannot be identified, an error is output to stop machining. If the reference position is identified, it is determined whether or not the reference position is deviated from a given taught position. If there is a deviation, PC 8 corrects whole data of irradiation positions based on the amount of the deviation. In accordance with the corrected data, XY(Z) table 6 moves workpiece 13 to a first hot-air blow position.

After local-hot-air generator 157 blows hot air to a joint position for a predetermined time, XY(Z) table 6 moves workpiece 13 to a first irradiation position. After irradiation of a predetermined output of light energy for a predetermined time, workpiece 13 is moved to a second hot-air blow position. After local-hot-air generator 157 blows the hot air to a joint position for a specified time, XY(Z) table 6 moves workpiece 13 to a second irradiation position. After irradiation of a predetermined output of light energy for a specified time, workpiece 13 is moved to a third hot-air blow position.

The moving of workpiece 13, the blowing of the hot air, and the irradiation of the light energy are thus repeated until an N-th irradiation position (where N is the total number of irradiation positions) is completed, and then, machining of workpiece 13 terminates when the irradiation for the N-th position is finished. The preheating performed by local-hot-air generator 157 allows the joint position to be directly heated, thereby not only vaporizing and reducing solvent contained in the solder cream in a short time but also preheating only a necessary portion.

If bare IC chip 153 is mounted on substrate 160 of workpiece 13 in another process, the quality of bare IC chip 153 might decline when its temperature is raised. Even in this case, the short-time and high-quality soldering using the light energy without scattering of a solder ball can be performed for only a necessary portion.

(Exemplary Embodiment 19)

Figure 20:
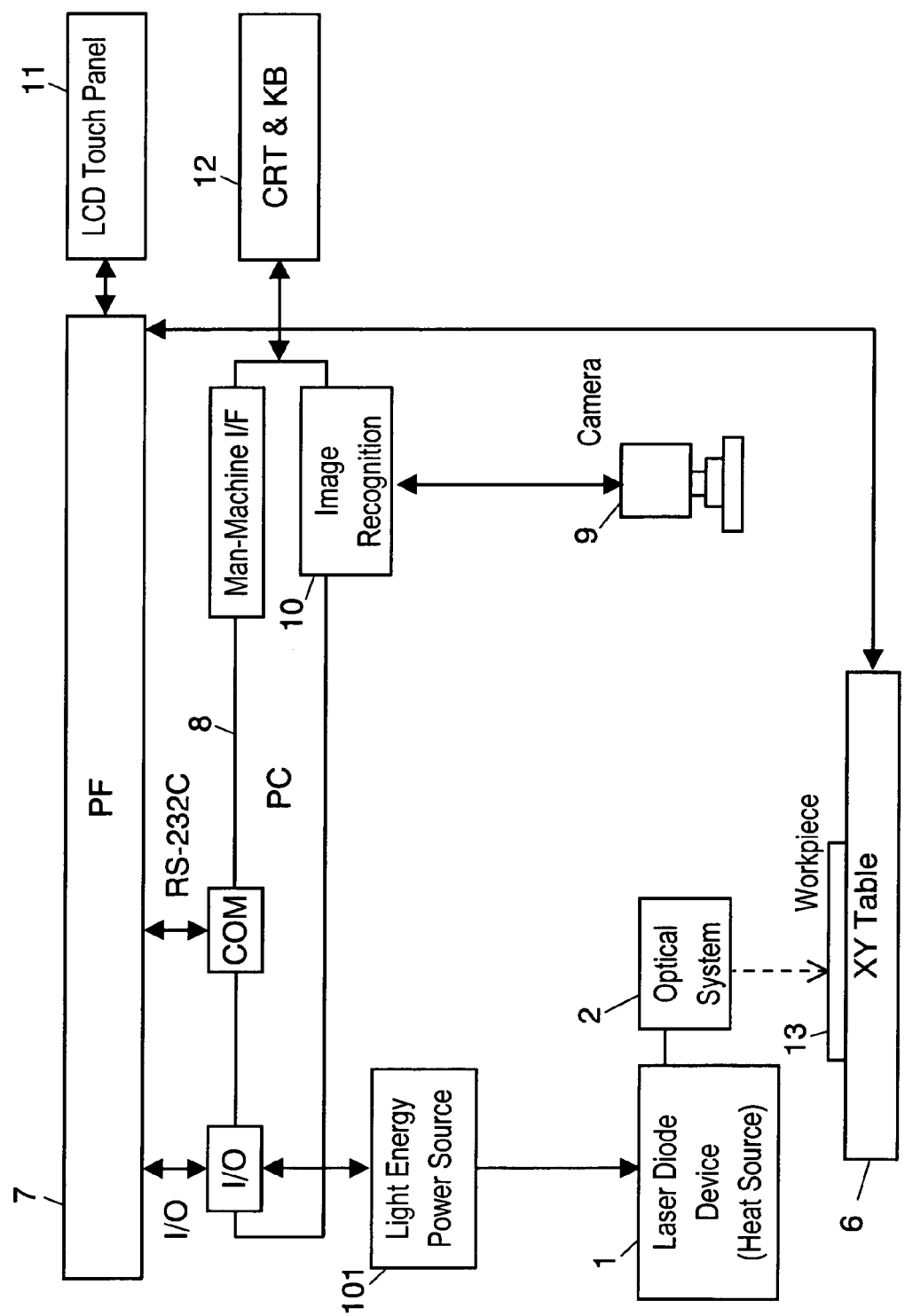
FIG. 20 is a schematic diagram of a machining apparatus in accordance with a nineteenth exemplary embodiment of the invention.
Figure 21:
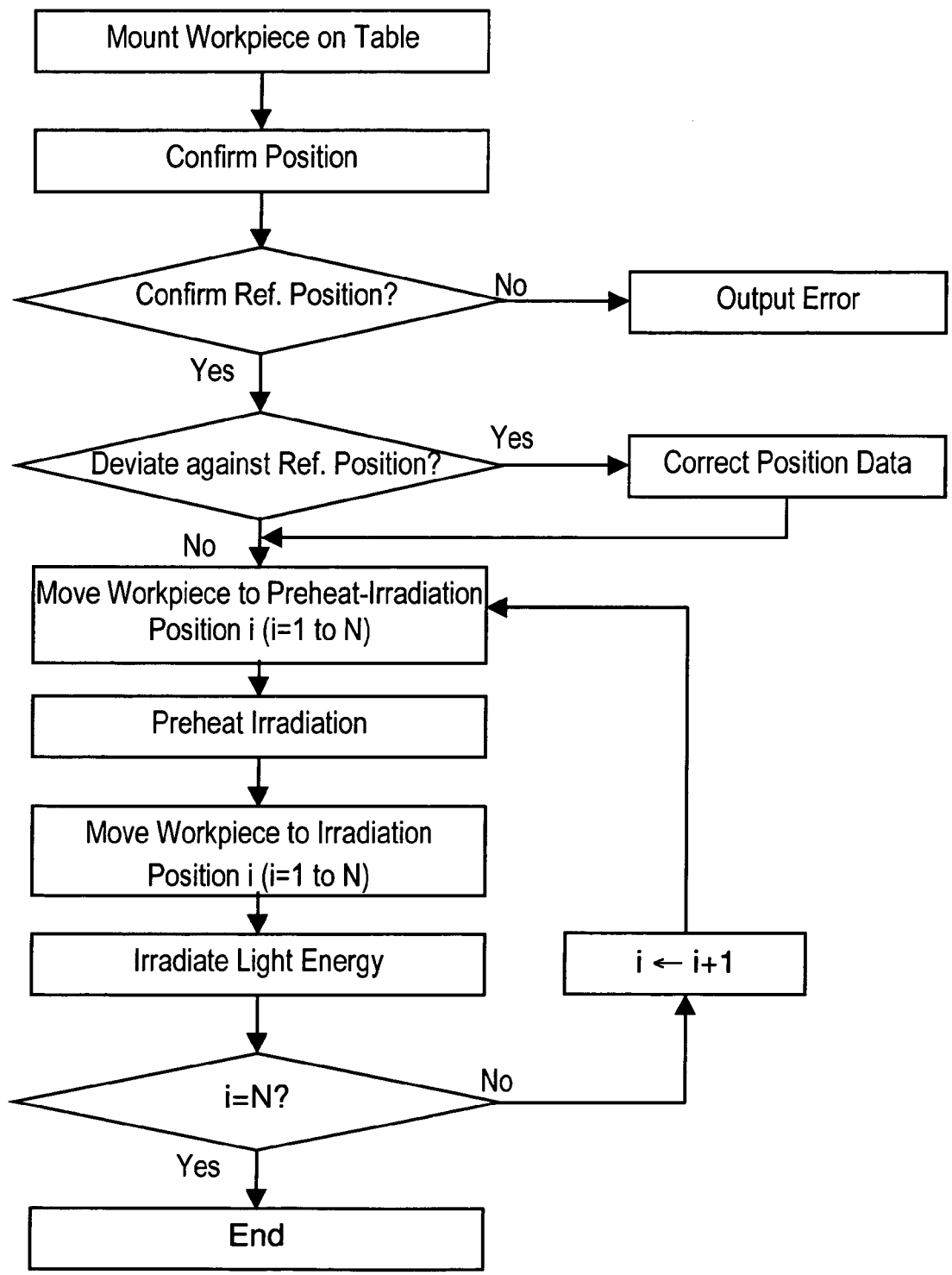
FIG. 21 is a flow chart of a machining method in accordance with the nineteenth embodiment.
Figure 22A:
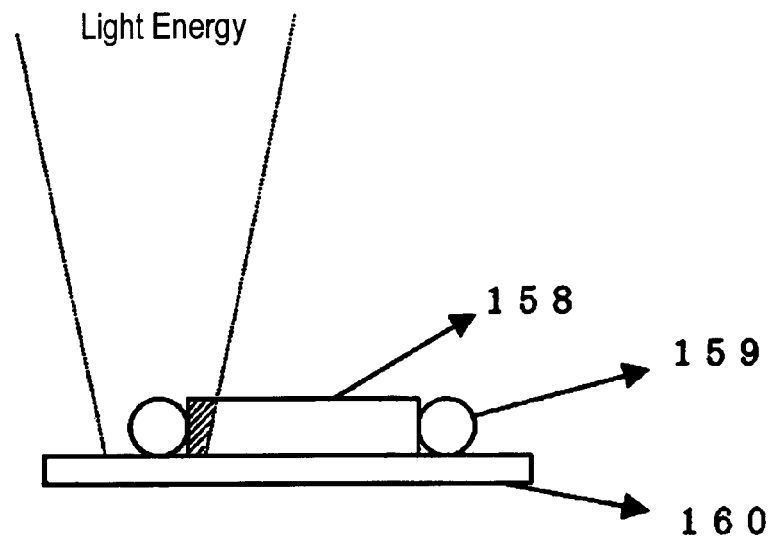
FIGS. 22A and 22B illustrate a machining method in accordance with a twentieth exemplary embodiment of the invention.
Figure 22B:
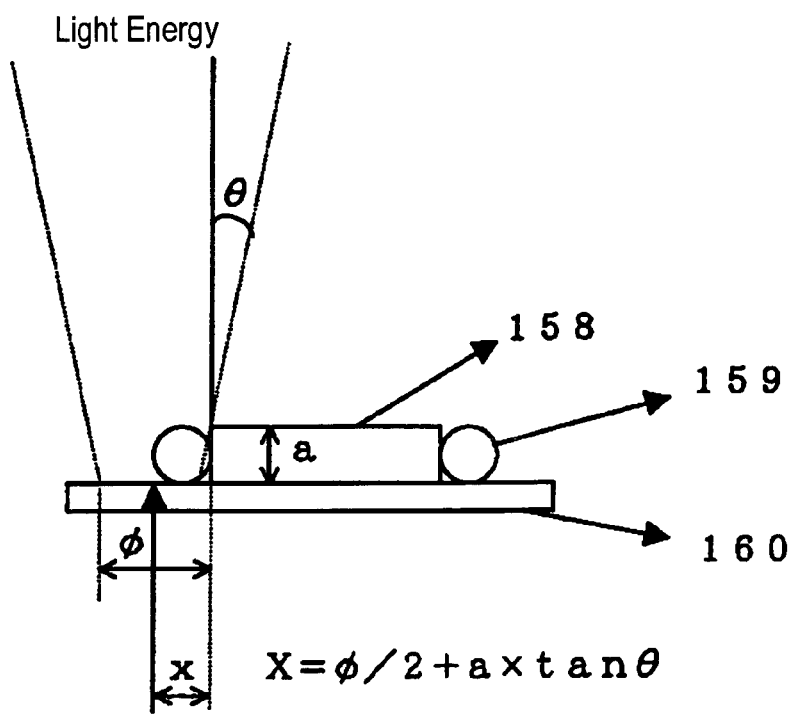

Referring to FIGS. 20 and 21, exemplary embodiment 19 of the present invention will be described. FIG. 20 shows a machining apparatus which does not include heating device 5b or temperature sensor 5c included in a machining apparatus of FIG. 12.

FIGS. 20 and 21 illustrate a machining apparatus and a flowchart of a machining method in accordance with the present embodiment. First, solder cream 159 is applied to substrate 160, and component 158 is mounted on substrate 160, as shown in FIG. 22. Workpiece 13 thus obtained is placed on table 6, as shown in FIGS. 20 and 21. Next, camera 9, image recognition device 10, and PC 8 identify a reference position. If the reference position cannot be identified, an error is output to stop machining. If the reference position is identified, it is determined whether or not the reference position is deviated from a given taught position. If there is a deviation, PC 8 corrects whole data of irradiation positions based on the amount of the deviation.

In accordance with the corrected data, XY(Z) table 6 moves workpiece 13 to a first preheat-irradiation position. After irradiation of a predetermined output P1 of light energy for a specified time, XY(Z) table 6 moves workpiece 13 to a first irradiation position. After irradiation of a predetermined output P2 of light energy for a specified time, workpiece 13 is moved to a second preheat-irradiation position. After irradiation of the predetermined output P1 of light energy for a specified time, XY(Z) table 6 moves workpiece 13 to a second irradiation position.

After irradiation of the predetermined output P2 of light energy for a specified time, workpiece 13 is moved to a third preheat-irradiation position. The moving workpiece 13, the preheating by the light energy, and the irradiation of the light energy are repeated until an N-th irradiation position (where N is the total number of irradiation positions) is completed. Machining of workpiece 13 terminates when irradiation for the N-th position is finished. It is noted that P1<P2.

The preheating by the light energy allows a joint position to be directly heated, thereby not only vaporizing and reducing solvent contained in the solder cream for a short time but also preheating only a necessary portion. Since the apparatus requires no special device for preheating, energy, cost and thus, space can be saved.

Even if for example, a bare IC chip having a quality declining according to a temperature rise is mounted on substrate 160 of workpiece 13 in another process, inexpensive, short-time and high-quality soldering using the light energy without scattering of a solder ball can be performed only for a necessary portion.

(Exemplary Embodiment 20)

FIGS. 22A and 22B show detail a state of applied light energy in a machining method in accordance with exemplary embodiment 20. The light energy is condensed by an optical system for joining, and an obtained spotlight is smaller than component 158 mounted on workpiece 13, as shown in FIG. 22A. A center of irradiated light is aligned at a center of solder cream 159, so that only a diagonally shaded portion of mounted component 158 is directly influenced by the light energy, as shown in FIG. 22A.

The condensing of the light energy and the aligning of the irradiation position with the center of the joint position can thus cause solder cream 159 to melt without excessive thermal stress for mounted component 158.

If component 158 having a small heat resistance is joined, the portion of mounted component 158 directly susceptible to the light energy shown in FIG. 22A may cause problem. Accordingly, as shown in FIG. 22B, the irradiation position is deviated from the center of the joint position, and irradiation position X is calculated from height a of mounted component 158, irradiation angle θ, and diameter φ of the condensed light energy.

This arrangement does not cause the light energy to directly affect mounted component 158, as shown in FIG. 22B, and thereby, solder cream 159 can be melted without excessive thermal stress for mounted component 158 even if component 158 have the small heat-resistance.

(Exemplary Embodiment 21)

Figure 23:
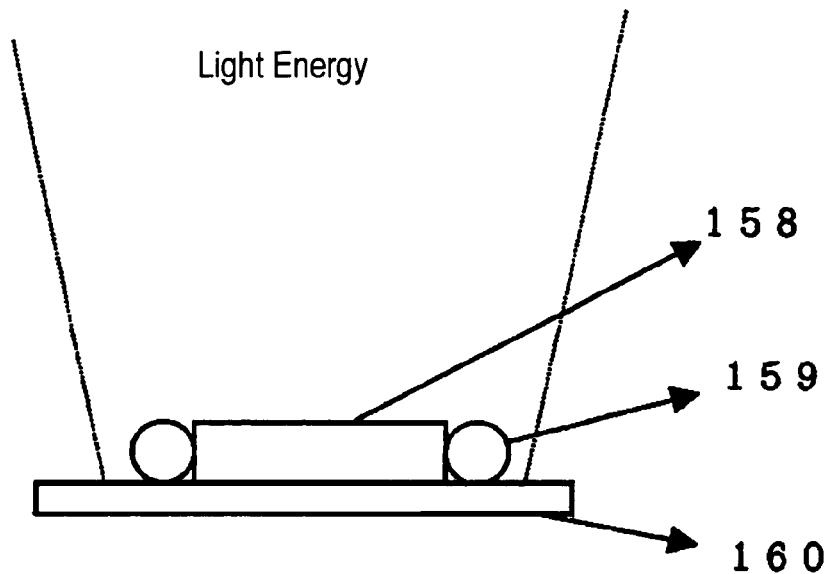
FIG. 23 illustrates a machining method in accordance with a twenty-first exemplary embodiment of the invention.

FIG. 23 shows a detail of applied light energy in a machining method in accordance with exemplary embodiment 21. During joining, light is applied to mounted component 158 and joints respective ends of component 158. Although the entire of mounted component 158 is directly affected by the light energy, there is no problem if component 158 have s large heat-resistance.

Such an irradiation allows the two joints to be irradiated once for the joining and can thus shorten machining time. According to the present embodiment, the light is applied to the two parts at a time. However, the number of parts to be irradiated is not limited to two.

(Exemplary Embodiment 22)

Figure 24:
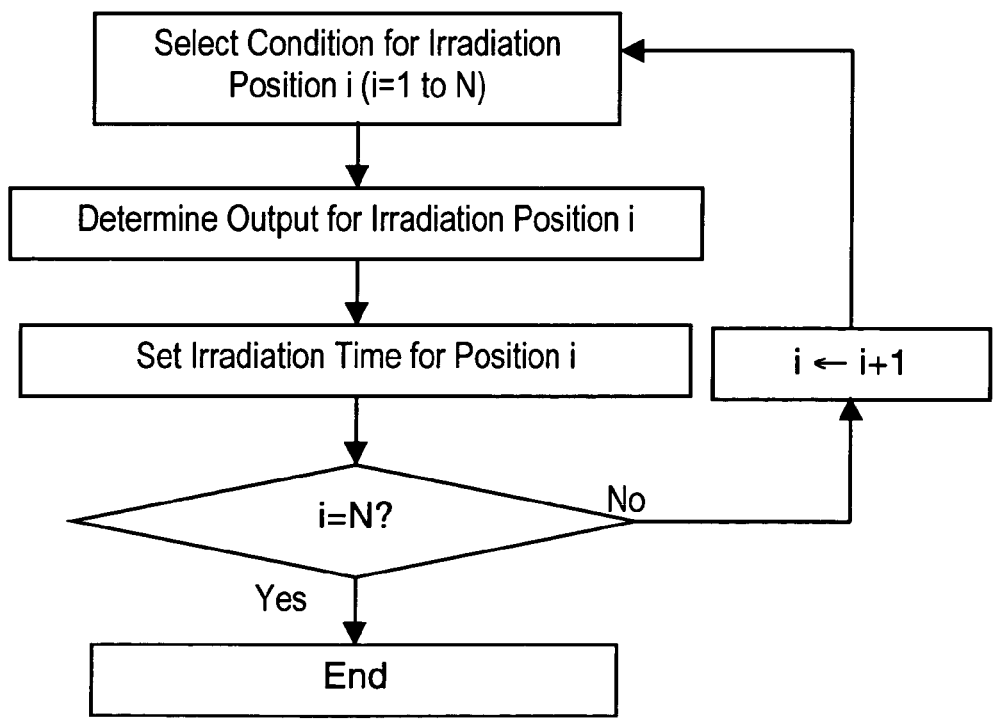
FIG. 24 is a flowchart of a machining method in accordance with a twenty-second exemplary embodiment of the invention.

Exemplary embodiment 22 of the present invention will be described with reference to FIG. 24. FIG. 24 is a flowchart for setting a condition for each irradiation position.

As shown in FIG. 24, an output of light energy and an irradiation time can be specified for each irradiation position. In actual machining, irradiation is performed with the output of the light energy and the irradiation time adjusted according to heat capacity of an object to be irradiated, so that solder cream 159 melts with an appropriate amount of light energy without excessive thermal stress for a mounted component.

(Exemplary Embodiment 23)

Figure 25:
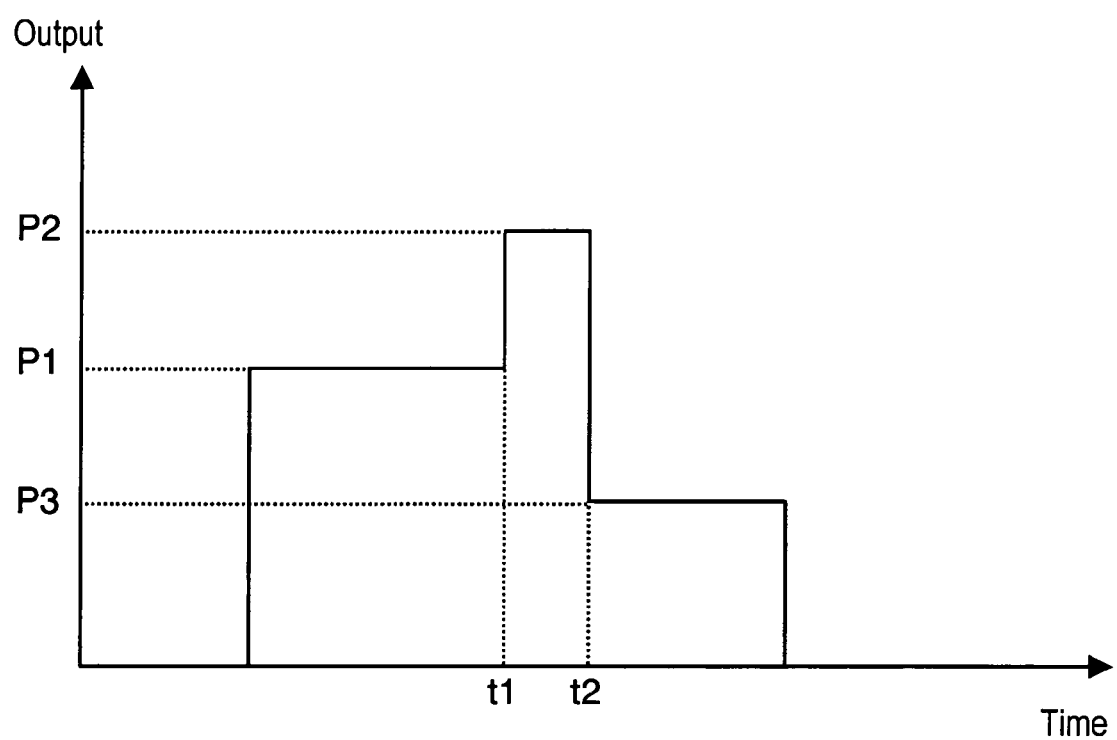
FIG. 25 shows a light radiation profile in accordance with a twenty-third exemplary embodiment of the invention.

Referring to FIG. 25, exemplary embodiment 23 of the present invention will be described. FIG. 25 shows a light energy radiation profile in a machining method of the invention. After a lapse of time t1 from the start of irradiation, an output of light is increased from output P1 to output P2, and, after a lapse of time t2, the output of the light is decreased from output P2 to output P3. This profile allows a temperature around a joint to change according to positive and negative gradients, thus allowing solder cream to melt smoothly and allowing a fillet which results from solidification to be formed after the melting.

(Exemplary Embodiment 24)

Figure 26:
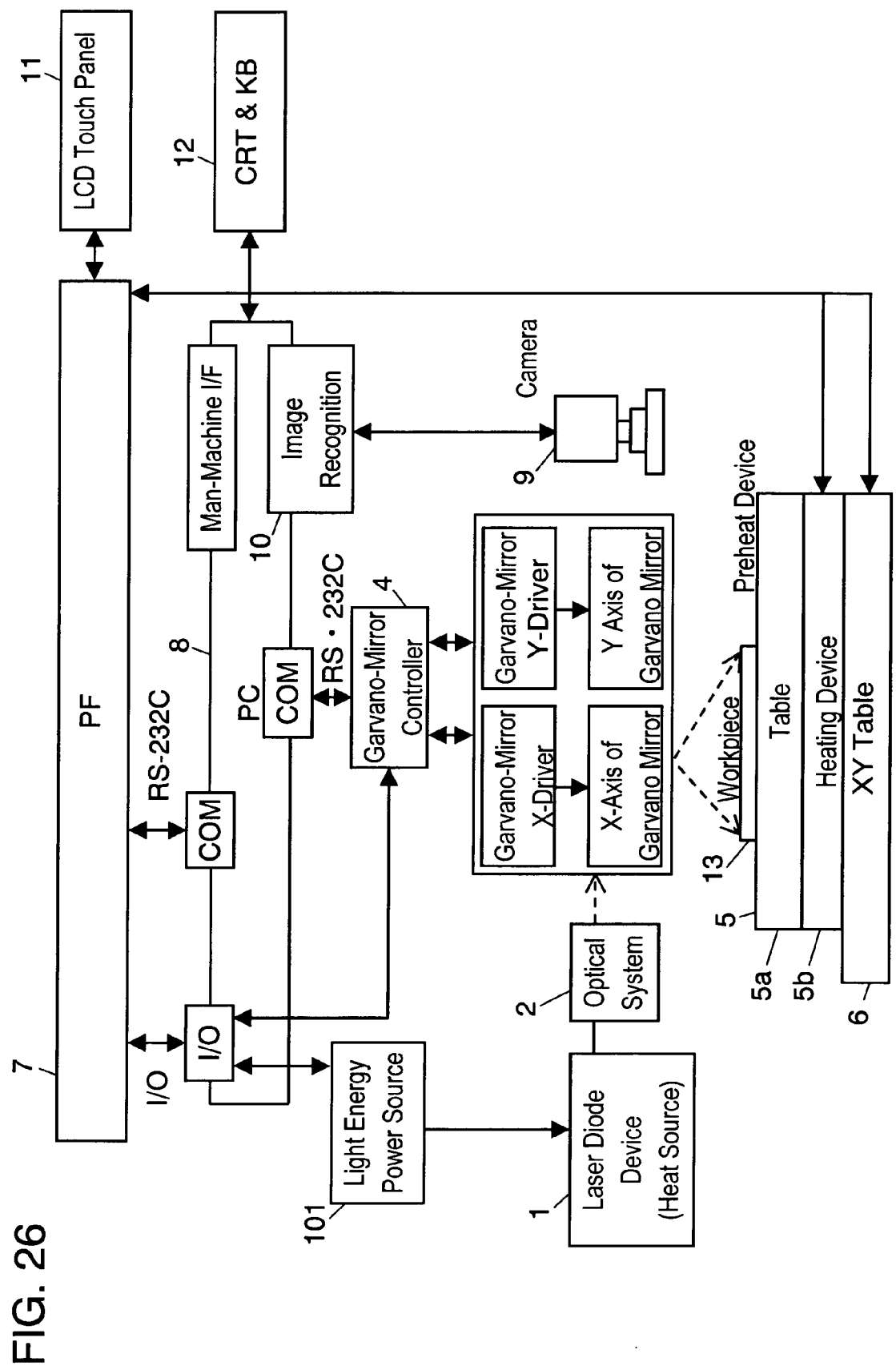
FIG. 26 is a schematic diagram of a machining apparatus in accordance with a twenty-fourth exemplary embodiment of the invention.
Figure 27:
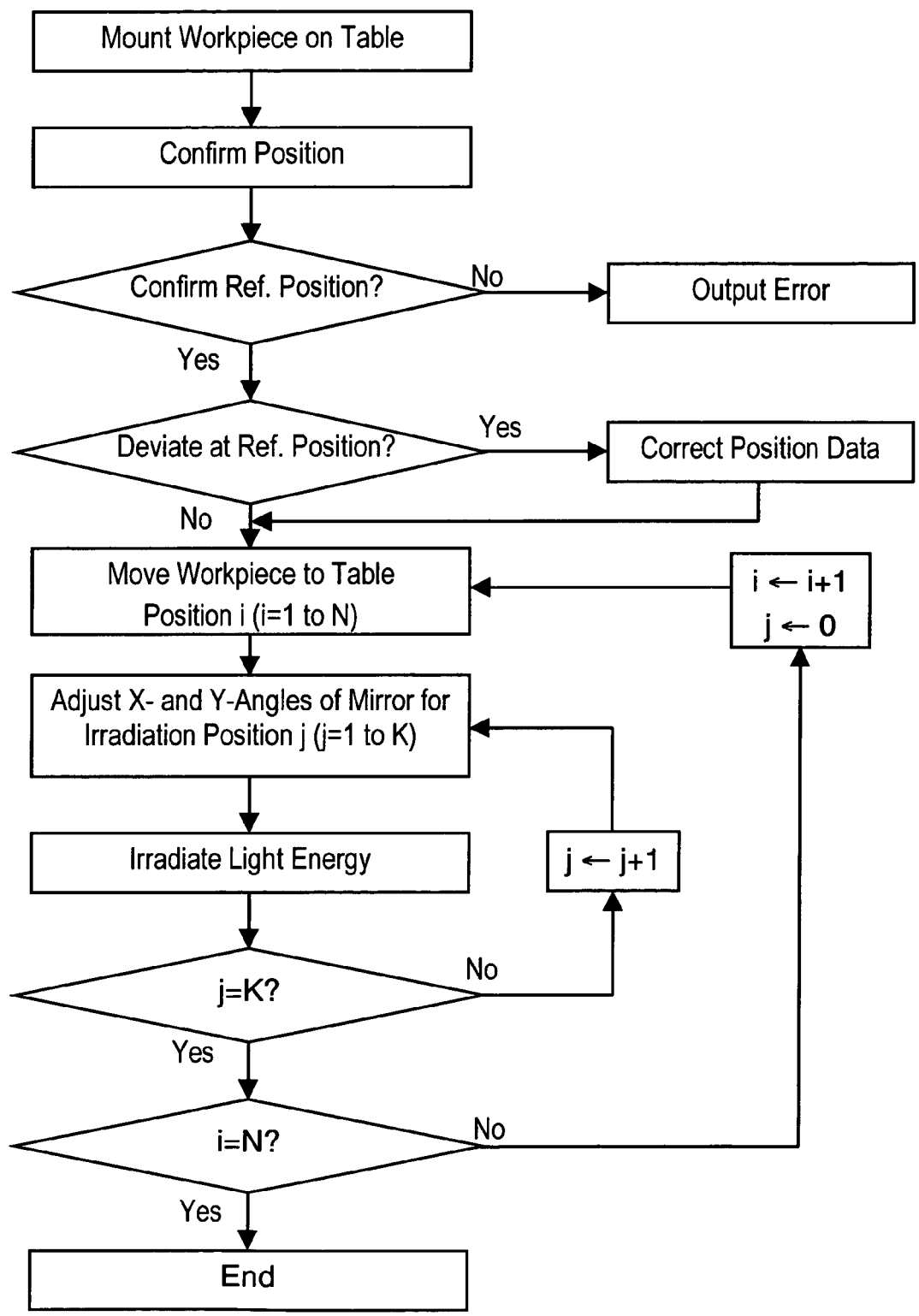
FIG. 27 is a flowchart of a machining method in accordance with the twenty-fourth embodiment.

Referring to FIGS. 26 and 27, exemplary embodiment 24 of the present invention will be described. FIG. 26 illustrates a machining apparatus including galvano-mirror controller 4 and galvano-mirror 3 additionally to a machining apparatus of FIG. 12. FIG. 27 is a flowchart of a machining method using this apparatus.

First, solder cream 159 is applied to substrate 160, and component 158 is mounted on substrate 160, as shown in FIG. 22. Workpiece 13 thus obtained is placed on table 5a, as shown in FIGS. 26 and 27. Since heating device 5b heats table 5a, preheating starts soon after workpiece 13 is placed.

Next, camera 9, image recognition device 10, and PC 8 identify a reference position. If the reference position cannot be identified, an error is output to stop machining. If the reference position is identified, it is determined whether or not the reference position is deviated from a given taught position. If there is a deviation, PC 8 corrects whole data of irradiation positions based on the amount of the deviation. In accordance with the corrected data, XY(Z) table 6 moves workpiece 13 to a first table position.

In order to enable irradiation to a first irradiation position, an X-axis angle and a Y-axis angle of galvano-mirror 3 are adjusted, and a predetermined output of light energy is applied for a specified time. Then, the X-axis angle and the Y-axis angle of galvano-mirror 3 are re-adjusted to enable irradiation to a second irradiation position, and a predetermined output of light energy is applied for a specified time. The changing of the angles of the mirror and the irradiation are repeated until a K-th irradiation position (where K is the total number of irradiation positions for the first table position) is completed. After irradiation to the K-th position terminates, XY(Z) table 6 moves workpiece 13 to a second table position.

For the second table position, similarly, the change of the angles of the mirror and the irradiation are repeated for each irradiation position, and XY(Z) table 6 moves workpiece 13 to the next table position after the irradiation to a final irradiation position is completed. The moving of the table, the changing of the angles, and the irradiation are repeated until an N-th table position is completed. After irradiation of light energy for the N-th position is finished, machining of workpiece 13 terminates.

Such a combination of XY(Z) table 6 and galvano-mirror 3 can extend a range of irradiation, i.e., machining. Since galvano-mirror 3 can adjust the angles fast for application of the light, a second joint of the mounted component can be irradiated soon after a first joint of the component is irradiated. Thus, the component can be prevented from standing due to a thermal imbalance between plural of joints of the mounted component.

A preheating performed by heating device 5b removes hygroscopic component from solder cream 159 and facilitates removal of an oxide film performed by melting flux. The solder is heated up to a temperature lower than and close to a boiling point of solvent included in the flux contained in solder cream 159, so that the solvent can be vaporized and reduced in a short time.

Since the preheating lasts for a short time, oxidation of solder component of the solder during the preheating time is negligible. Thus, the solvent does not burst by expanding during vaporization even when only the joint is heated quickly by the light energy. For this reason, high-quality soldering without scattering of a solder ball can be performed.

(Exemplary Embodiment 25)

Figure 28A:
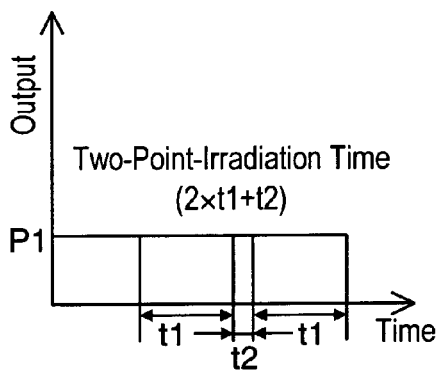
FIGS. 28A–28F illustrate light radiation profiles in accordance with a twenty-fifth exemplary embodiment of the invention.
Figure 28B:
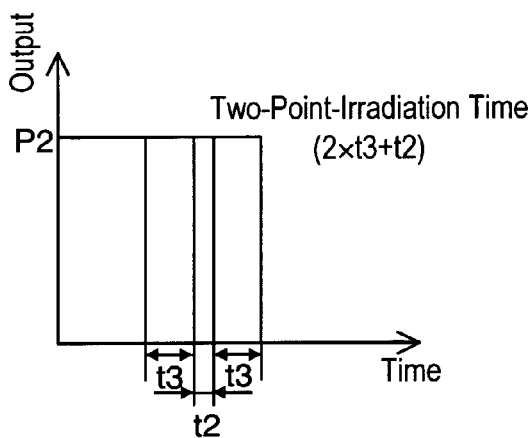

FIGS. 28A to 28F illustrate light energy radiation profiles and necessary times for irradiation in a machining method in accordance with exemplary embodiment 25. As shown in FIG. 28A, necessary time T1 for irradiating two positions with output P1 for irradiation time t1 is determined as T1=2×t1+t2, where t2 is a time required for moving a workpiece. As shown in FIG. 28B, necessary time T2 for irradiating two positions with the output P2, which is increased from output P1, for time t3, which is reduced from time t1 is expressed as T2=2×t3+t2. If t1=0.5 s, t2=0.01 s, and t3=0.2 s, the necessary time can be reduced from T1=2×(t1+t2)=1.01 s to T2=2×t3+t2=0.41 s. In actual irradiation, however, excessively-large output may reduce soldering quality, burning a substrate, a solder ball. Thus, simply-raising of the output and simply-reducing of the time may not provide satisfactory machining.

Figure 28C:
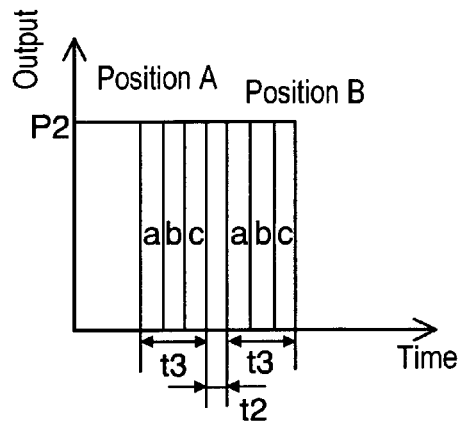
Figure 28D:
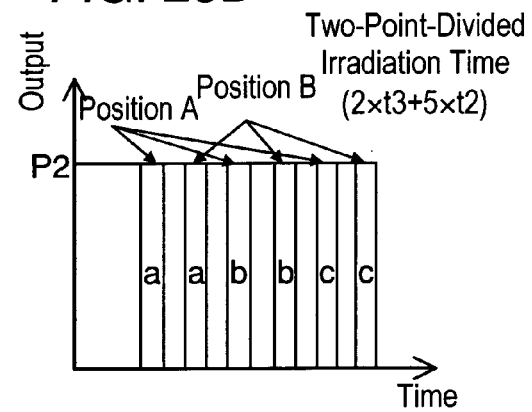

Accordingly, time t3 for applying light is divided into three times a, b, and c, as shown in FIG. 28C. As shown in FIG. 28D, after output P2 of light is applied to position A for time a, the workpiece is moved to position B where output P2 of light is applied for time a. Next, the workpiece is returned to position A where the light is applied for time b, and is then moved to position B where the light is applied for time b. The dividing of the irradiation in such a manner allows the workpiece to be irradiated for extremely short time with a large-power light, thus allowing the workpiece to be jointed without reducing the quality.

Necessary time T3 for performing the divided irradiation for the two positions is expressed as T3=2×t3+5×t2=0.45 s. A shorter time for the moving makes necessary time T3 approach the necessary time for non-divided irradiation, thus reducing the irradiation time sufficiently.

Figure 28E:
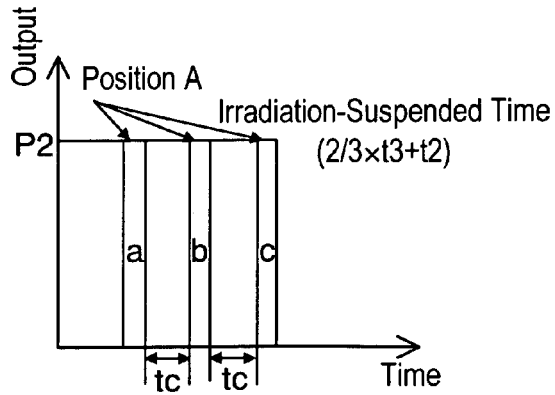
Figure 28F:
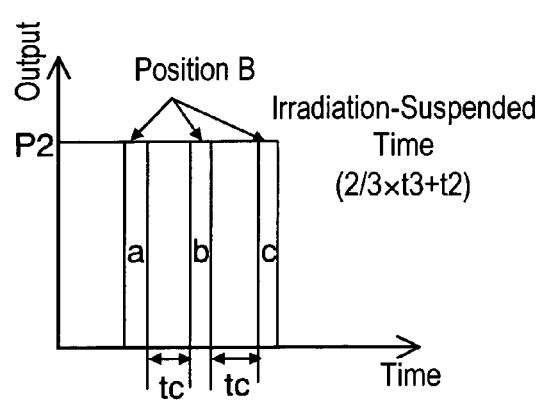

The dividing of the irradiation prevents a mounted component from standing. This is because galvano-mirror 3, which has an angle adjusted fast, allows a second joint to be irradiated with light soon after a first joint is irradiated. It is noted, however, that the joint is not joined completely by one irradiation. As shown in FIGS. 28E and 28F, the light may be applied three times for each of positions A and B to complete joining. This profile prevents a thermal imbalance between plural joints of the mounted component, thus preventing the component from standing.

(Exemplary Embodiment 26)

Figure 29A:
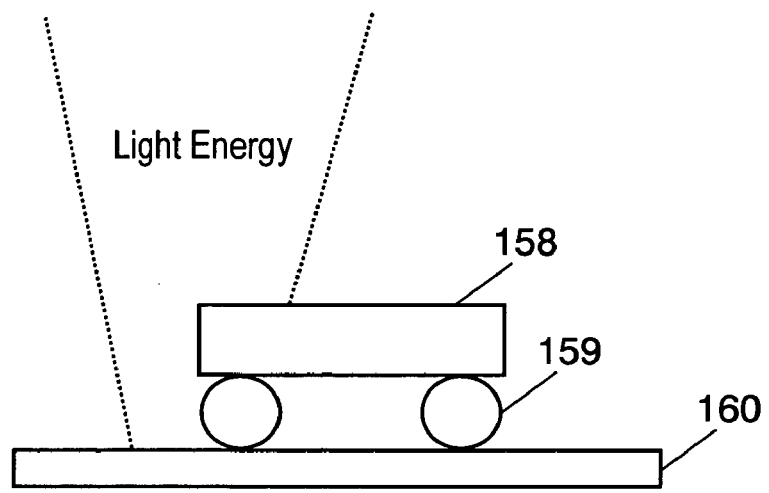
FIGS. 29A and 29B illustrate light radiation profiles in accordance with a twenty-sixth exemplary embodiment of the invention.
Figure 29B:
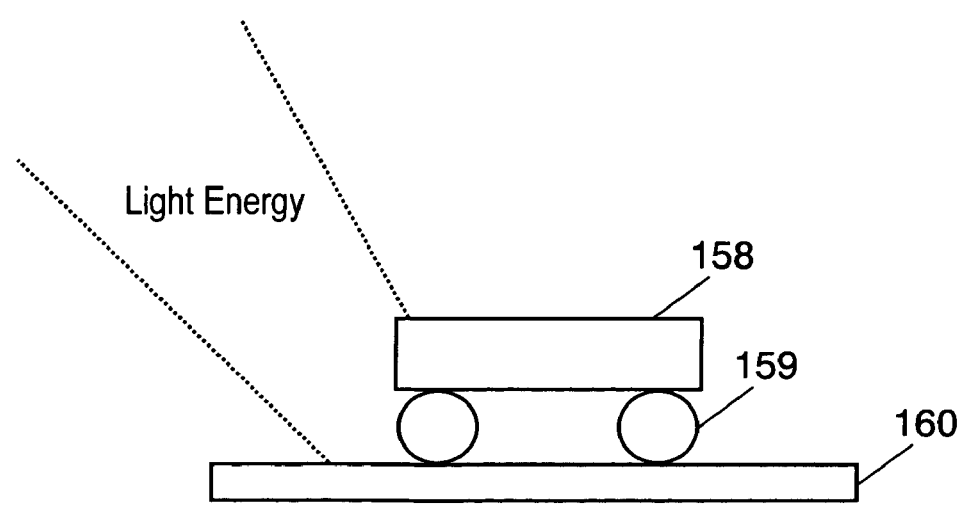

Referring to FIGS. 29A and 29B, exemplary embodiment 26 of the present invention will be described.

A joint to be soldered is located under mounted component 158. As shown in FIGS. 29A and 29B, component 158 and the joint under the component are irradiated with energy for joining. If light energy is applied to component 158 directly from above component 158, as shown in FIG. 29A, the light energy is blocked by the component, thus hardly reaching solder cream 159 under the component.

Therefore, the position of optical system 2, XY(Z) table 6, or an angle of galvano-mirror 3 is adjusted to apply the light energy slantingly from above the component, as shown in FIG. 29B. This arrangement allows solder cream 159 to melt without excessive thermal stress for mounted component 158.

(Exemplary Embodiment 27)

Figure 30:
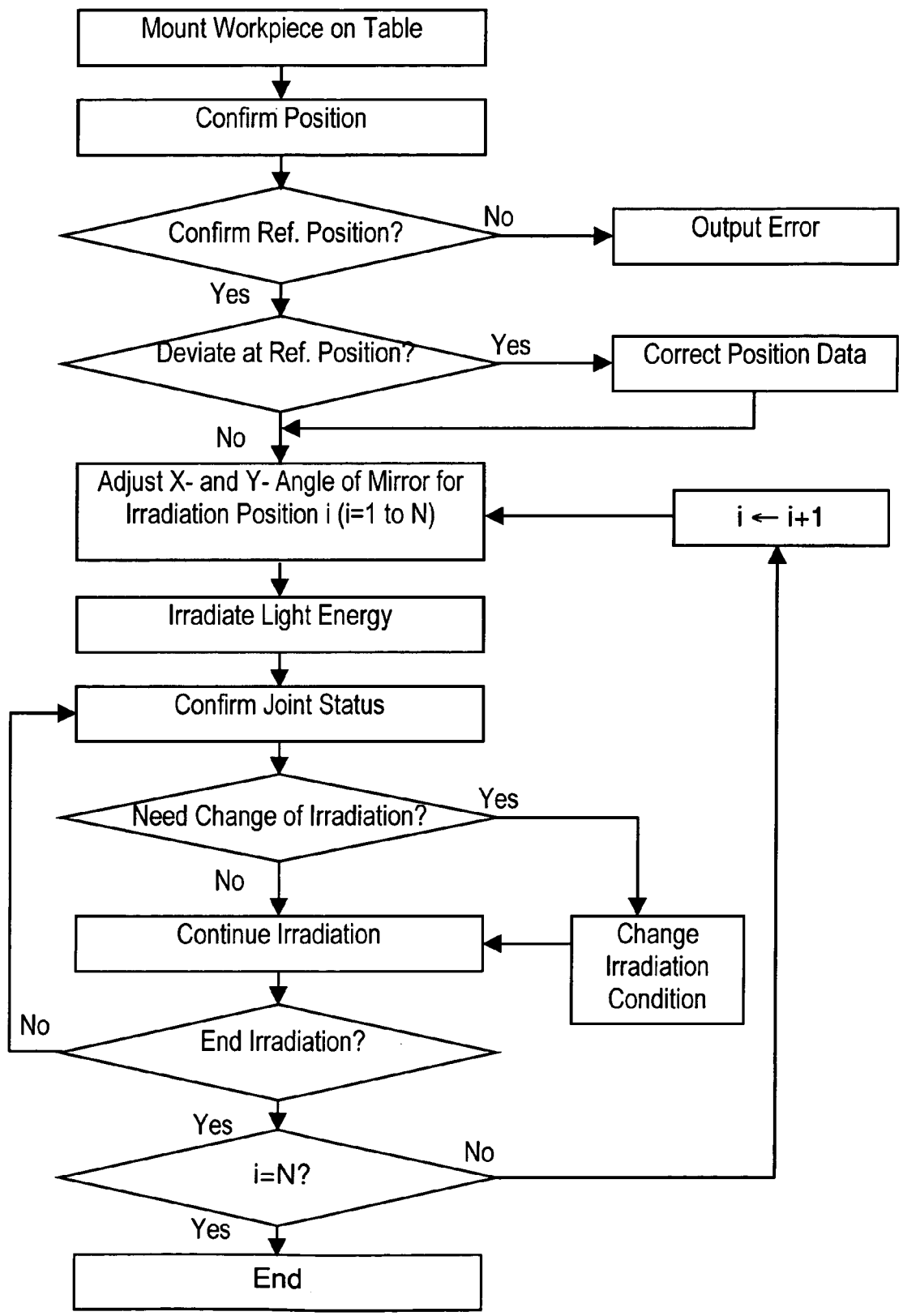
FIG. 30 is a flowchart of a machining method in accordance with a twenty-seventh exemplary embodiment of the invention.

FIG. 30 is a flowchart of a machining method in accordance with exemplary embodiment 27. First, workpiece 13 including substrate 160 mounted to component 158 and solder cream 159 applied to the substrate is placed on table 5a. Since heating device 5b heats table 5a, preheating starts soon after workpiece 13 is placed. Next, camera 9, image recognition device 10, and PC 8 identify a reference position. If the reference position cannot be identified, an error is output to stop machining.

If the reference position is identified, it is determined whether or not the reference position is deviated from a given taught position. If there is a deviation, PC 8 corrects whole data on irradiation positions based on the amount of the deviation. In accordance with the corrected data, An X-axis angle and a Y-axis angle of galvano-mirror 3 are adjusted to enable a first irradiation position to be irradiated, and a predetermined output of light energy is applied for a predetermined time. After a lapse of a specified time, a joining status is checked, and it is determined whether or not a changing of a condition is necessary. If the condition change is necessary, the output is changed by a specified amount. If the condition change is unnecessary, the irradiation further continues.

The status is thus monitored at a specified interval of time. When the joining is finished, the X-axis angle and the Y-axis angle of galvano-mirror 3 are changed to enable a second irradiation position to be irradiated, and the light energy is applied while a joining status is monitored. When the joining is finished, the X-axis angle and the Y-axis angle of galvano-mirror 3 are changed to enable the next irradiation position to be irradiated. The irradiating of each irradiation position while monitoring the joining status and changing the condition when necessary can secure stable joining quality.

It is noted that a method and a joining, such as soldering, a connecting configuration, illustrated examples, type of data, numeric data of the present invention are not limited to those described in this embodiment, and various modifications can be made without changing the purport of this invention.

(Exemplary Embodiment 28)

Figure 31:
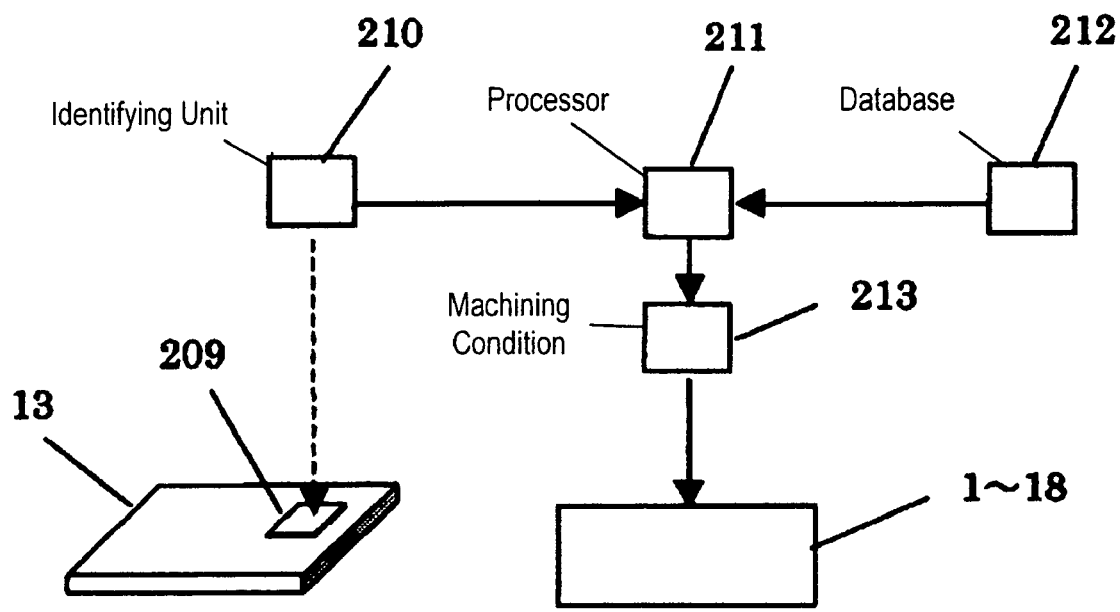
FIG. 31 illustrates identifying of a workpiece in a machining apparatus in accordance with a twenty-eighth exemplary embodiment of the invention.

When workpiece 13, which is assigned identification code 209, is put in one of machining apparatuses 1 to 18, as shown in FIG. 31, identifying unit 210 detects identification code 209, and thereby, various conditions of workpiece 13 are identified. Database 212 previously stores machining conditions corresponding to identification code 209.

Based on a signal from identifying unit 210, processor 211 retrieves optimum machining condition 213 from database 212. At production equipment equipped with one of machining apparatuses 1 to 18 which captures optimum machining condition 213, and the workpiece is soldered.

Identifying unit 210 may be implemented by an image recognition device, and identification code 209 may include library data, such as CAD data or bar-coded data. Identifying unit 210 and identification code 209 allow the type of workpiece 13 to be identified automatically, thus allowing soldering satisfying the optimum machining condition even when different types of workpieces 13 are put at random to the machining apparatuses.

(Exemplary Embodiment 29)

Figure 32:
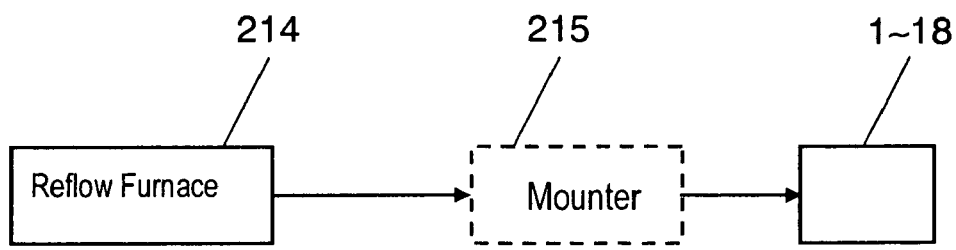
FIG. 32 shows a relationship between a machining apparatus and reflow in accordance with a twenty-ninth exemplary embodiment of the invention.

In FIG. 32, soldering is performed at production equipment equipped with one of machining apparatuses 1 to 18 that is disposed at a stage subsequent to reflow furnace 214. Or, mounter 215 for mounting an electronic component is disposed at the stage subsequent to reflow furnace 214. After mounter 215 mounts the component (not shown) which cannot be machined by reflow furnace 214 to workpiece 13, workpiece 13 is soldered at the production equipment equipped with one of machining apparatuses 1 to 18. This arrangement allows the component which cannot be treated by reflow furnace 214 to be soldered.

(Exemplary Embodiment 30)

Figure 33:
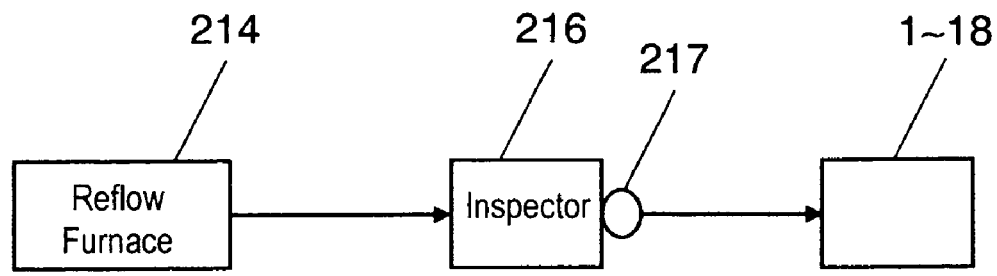
FIG. 33 illustrates identifying of a workpiece in a machining apparatus in accordance with a thirtieth exemplary embodiment of the invention.

As shown in FIG. 33, inspector 216 inspects a joined state of workpiece 13 which comes out of reflow furnace 214, and outputs inspection result 217 to one of machining apparatuses 1 to 18. At production equipment equipped with the one of machining apparatuses 1 to 18, a portion (not shown) of workpiece 13 to be joined and to be determined as not being joined is soldered based on inspection result 217. The apparatus can thus perform soldering in accordance with a result of joining performed by reflow furnace 214.

(Exemplary Embodiment 31)

Figure 34:
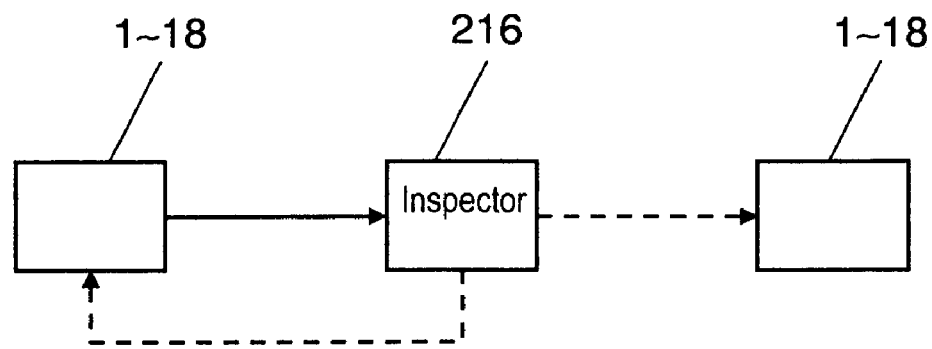
FIG. 34 shows a relationship between a machining apparatus and an inspector in accordance with a thirty-first exemplary embodiment of the invention.

Referring to FIG. 34, exemplary embodiment 31 of the present invention will be described. As shown in FIG. 34, inspector 216 is disposed at a stage subsequent to one of machining apparatuses 1 to 18 to inspect a joined state of workpiece 13. Workpiece 13 having a portion (not shown) to be joined and to be determined as not being joined is sent back to the machining apparatus in the prior process, and is joined based on a signal from inspector 216 at production equipment equipped with the machining apparatus.

Workpiece 13 having the portion to be joined and to be is determined as not being joined may be put into a machining apparatus in a subsequent stage, and is soldering based on the signal from inspector 216 at production equipment equipped with the machining apparatus. The machining apparatus can thus solder the portion in accordance with a result of joining performed by reflow furnace 214.

(Exemplary Embodiment 32)

Figure 35:
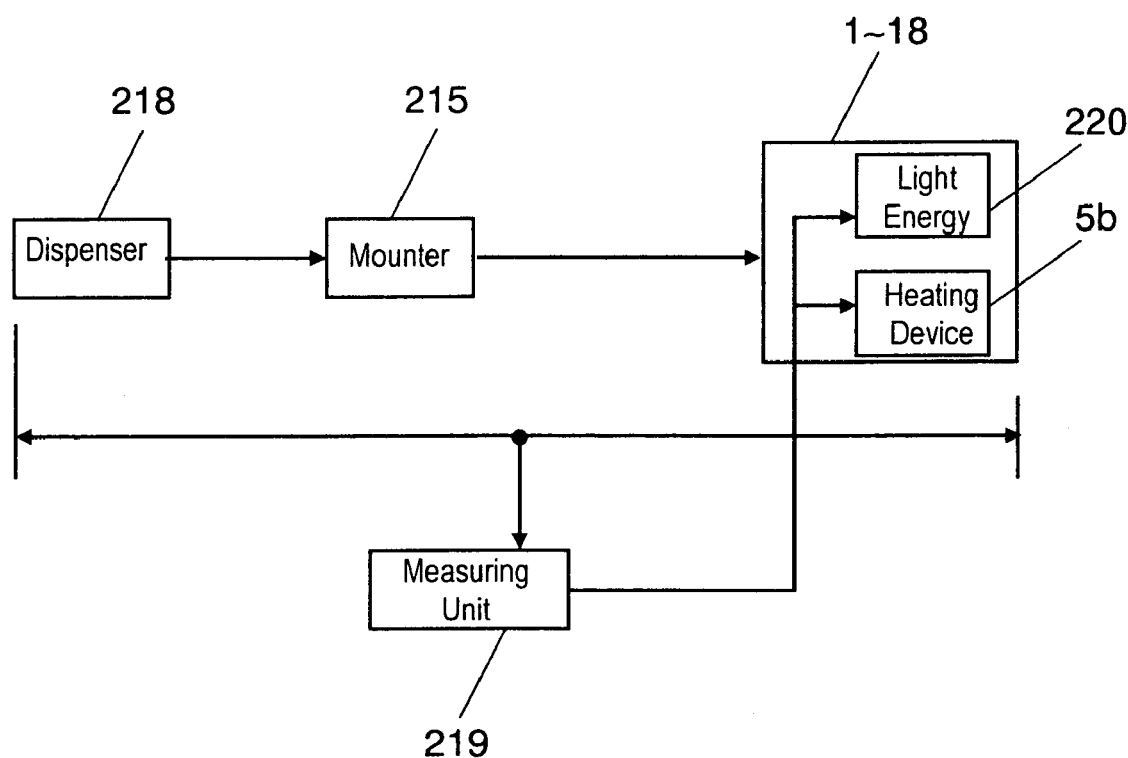
FIG. 35 illustrates a structure between a machining apparatus and a dispenser in accordance with a thirty-second exemplary embodiment of the invention.

Exemplary embodiment 32 of the present invention will be described with reference to FIG. 35. In FIG. 35, dispenser 218 applies joining material (not shown) to a joint position of workpiece 13, and mounter 215 is disposed in a stage subsequent to dispenser 218. In a stage subsequent to mounter 215, one of machining apparatuses 1 to 18 applies light energy 220 to the joint position of the workpiece (not shown) which come out of mounter 215 for soldering. Measuring unit 219 measures a time from the application of the joining material by dispenser 218 to the irradiation of light energy 220 by the machining apparatus. In accordance with an output from measuring unit 219, an output of light energy 220 or heating device 5b is adjusted, and thereby, optimum soldering can be performed.

(Exemplary Embodiment 32)

Figure 36:
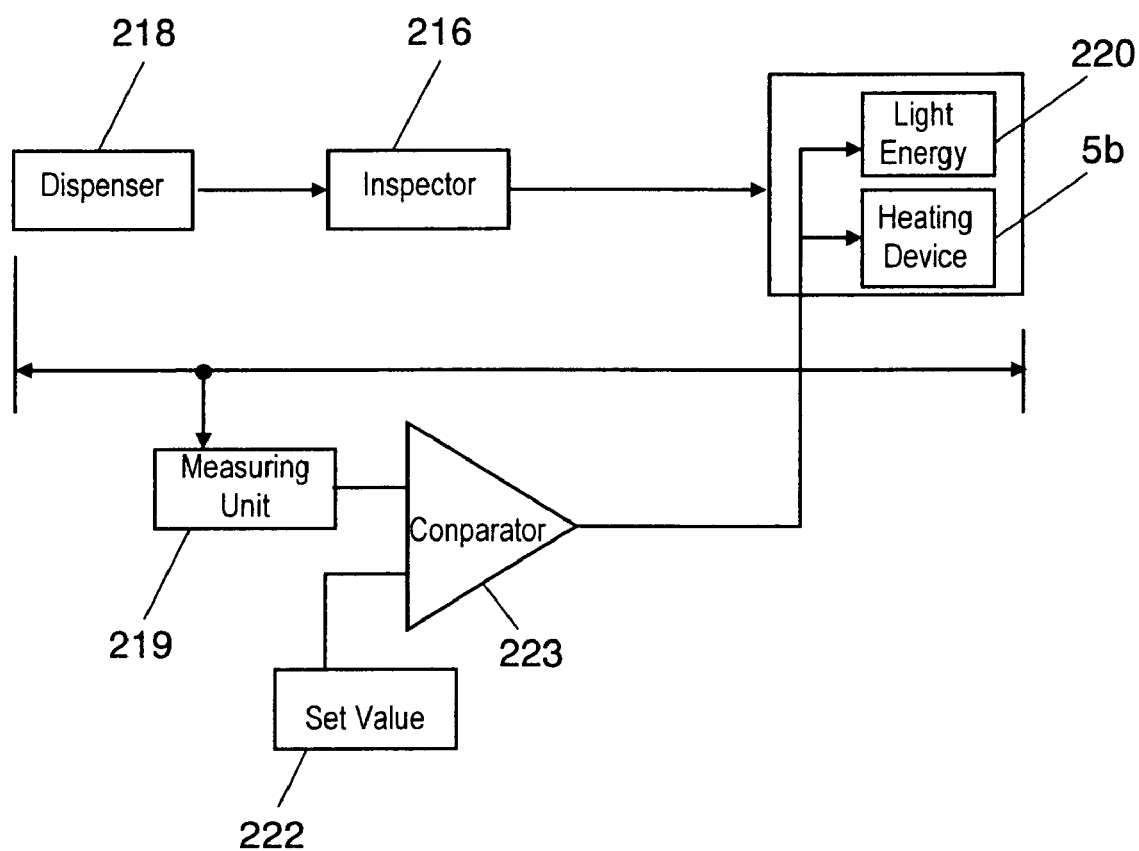
FIG. 36 illustrates a structure between a machining apparatus and a dispenser in accordance with a thirty-third exemplary embodiment of the invention.

Referring to FIG. 36, exemplary embodiment 23 of the present invention will be described. As shown in FIG. 26, similarly to FIG. 37, measuring unit 219 for measuring a time elapsed from application of joining material by dispenser 218 to irradiation of light energy 220 by one of machining apparatuses 1 to 18. Comparator 223 compares an output from measuring unit 219 with a predetermined time 222 previously input in order to determine an output of light energy 220 or heating device 5b, so that optimum soldering can be performed.

It is noted that a method of joining, such as soldering, a method of machining resin, a connecting configuration, an illustrated example, type of data, numeric data, and others of the present invention are not limited to those described in the first to thirty-third embodiments, and various modifications can be made without changing the purport of this invention.

INDUSTRIAL APPLICABILITY

A machining apparatus and a machining method according to the present invention stabilize quality of joining performed for a workpiece by preheating, allow short-time machining and energy saving by high-speed local heating, and cause no thermal damage to an electronic component. An optical system provides light energy to an arbitrary position of the workpiece and can thus change an irradiation position of the light energy at a high speed.

A heating device for heating a table can shorten machining time. A varying of the light energy according to the position of the workpiece optimizes the energy and machining time according to heat capacity which varies depending on a machining position.

A moving of the table can extend a moving range achieved by the optical system, so that a large-size workpiece can be handled. The light energy can vary according to the position of the workpiece. The energy and machining time can be optimized according to the heat capacity, which varies depending on the machining position. Various types of printed boards can be handled, and various types of components to be irradiated can be handled.

A density of the light energy applied to the workpiece can be controlled by changing the energy and an area of irradiation. An increasing of the density can shorten the machining time but is limited by heat resistance of the workpiece. Irradiation adapted to the shape or use of the workpiece can be performed.

The light energy applied to the machining position of the workpiece can be moved at the high speed, and the light energy can be specified for each arbitrary position of the workpiece. The energy and machining time can be optimized according to the heat capacity, which varies depending on the machining position. The high-speed irradiation can increase production.

A controller controls a power supply and the optical system, and thereby, an optimum light energy can be applied to the arbitrary position of the workpiece for an optimum machining time.

Based on a recognized result of machining performed for the workpiece, the next energy to be applied and the next machining position are corrected, thereby suppressing failure in machining, and a failure of machining can be recognized.

With a status of the workpiece recognized during machining, the next energy and machining position can be corrected in real time, thereby suppressing a failure of machining, and the failure can be recognized from the result of machining.

Even if the machining position of the workpiece is located outside a movable are of the light energy of the optical system, or even if the optical system does not have the function of guiding the light energy to the arbitrary position, the table is moved to allow the light energy to reach the arbitrary position of the workpiece.

Even when only a joint is heated quickly by the light energy, solvent does not burst by expanding during vaporization. For this reason, a solder ball or the like does not scatter. The machining apparatus is thus capable of high-quality soldering.

Since joining and cutting can be performed for the workpiece by a single machining apparatus, and thus, no cutting device is required.

Since joining and marking can be performed for the workpiece by a single machining apparatus, and thus, no marking device is required.

Since joining and surface reforming can be performed by a single machining apparatus, and thus no device for surface reforming is required.

An aperture absorbs an unnecessary portion of the light energy coming from a light source. An adjusting of an irradiated area of the workpiece can reduces a condensed area of light more than a performance of the optical system, thus performing finer machining. Deterioration of optical precision and the life of the optical system due to an element of the optical system heated by the unnecessary portion of the light energy does not occur.

A preheating stabilizes a quality during joining by holding the workpiece isothermally, and allows the workpiece to be heated locally and fast, and provides and energy saving while causing no thermal damage to the electronic component.

An adjusting of a heating device according to the type of the workpiece allows power saving and can suppress a temperature rise in the machining apparatus.

A workpiece fixing unit and a workpiece positioning unit are mounted to the heating device or the table, thereby enabling high-quality solderings.

Failure in soldering can be prevented by a workpiece float detecting function.

Functions of the power supply, the optical system, an output status, a focus are periodically checked automatically, thus enabling stable and high-quality soldering.

A way of teaching positional data of the workpiece can be selected, thus allowing the positional data of the workpiece to be taught into the machining apparatus according to positional data managed by a user.

Extensive and high-quality soldering can be performed for the workpiece even when only the joint is heated quickly by the light energy.

Vaporization of the solvent can be facilitated. The optical system can be protected by removal of a fume, and short-time and high-quality soldering can be performed even when only the joint is heated quickly by the light energy.

Vaporization of the solvent can be facilitated. A ambient temperature can be raised and preheating time can be shortened due to effect of preheating on soldering. Short-time and high-quality soldering can be performed even when only the joint is heated quickly by the light energy.

Even when only the joint is heated quickly by the light energy, the solvent does not burst by expanding during vaporization. For this reason, high-quality soldering without scattering of the solder ball can be performed.

Even if the mounted component has a small heat-resistance, high-quality soldering without scattering of the solder ball can be performed.

Even when only the joint is heated quickly by the light energy, the solvent does not burst by expanding during vaporization. For this reason, short-time and high-quality soldering without scattering of the solder ball can be performed.

Even when only the joint is heated quickly by the light energy, high-quality soldering without deterioration of the component can be performed.

Even when only the joint is heated quickly by the light energy, the solvent does not burst by expanding during vaporization. For this reason, high-quality soldering without scattering of the solder ball can be performed.

Even when only the joint is heated quickly by the light energy, the solvent does not burst by expanding during vaporization. For this reason, high-quality soldering providing savings of energy, cost and space without scattering of the solder ball can be performed.

Even when only the joint is heated quickly by the light energy, high-quality soldering causing no excessive thermal stress to the component without a decline in performance can be performed.

Even when only the joint is heated quickly by the light energy, short-time and high-quality soldering can be performed.

Even if joints of different types of components are heated quickly by the light energy, joining can performed for each of the components under an appropriate condition, thus allowing high-quality soldering.

Even when only the joint is heated quickly by the light energy, high-quality soldering, a fillet shaped in an appropriate shape at a solder joint after joining can be formed.

Even when only the joint is heated quickly by the light energy, extensive, short-time and high-quality soldering without making the component stand can be performed.

Even when only the joint is heated quickly by the light energy, high-quality soldering can be performed regardless of the shape of the component.

Even when only the joint is heated quickly by the light energy, stable and high-quality soldering can be performed.

Soldering of the workpiece which cannot be soldered in a reflow furnace can be performed.

Based on an inspection result of the workpiece to be joined in the reflow furnace, a portion determined as not being joined in the reflow furnace can be soldered, so that a defective workpiece need not be taken out before a subsequent process.

A portion which is determined as not being joined can be soldered based on the inspection result of a joined state, so that the defective workpiece need not be taken out before the subsequent process.

Based on an output from a measuring unit which measures a time elapsed from a dispenser to irradiation of the light energy by the machining apparatus, the light energy or the heating device is adjusted, so that appropriate preheating and appropriate supply of the light energy can be provided for the workpiece according to the time for moving the workpiece between the dispenser and the machining apparatus.

Based on the inspection result of the joined state, the portion that is not joined can be soldered, so that the defective workpiece need not to be taken out before to the subsequent process.

| | Reference Numerals |
|---|---|
| 1 | Laser Diode Device (Heat Source) |
| 2 | Optical System |

-continued

| Reference Numerals | |
|---|---|
| 3 | Galvano-Mirror |
| 4 | Galvano-Mirror Controller |
| 5a | Table |
| 5b | Heating Device |
| 6 | XY(Z) Table |
| 7 | Main Body of Apparatus |
| 8 | Controller |
| 9 | Camera |
| 10 | Image Recognition Device |
| 11 | Operating Panel |
| 12 | Monitor And Keyboard |
| 13 | Workpiece |
| 100 | Table Driver |
| 101 | Light-Energy Power Supply |
| 102 | Comparator |
| 103 | Machining Status Storage Unit |
| 104 | Machining Condition Storage Unit |
| 105 | Machining Position Storage Unit |
| 106 | Table Controller |
| 107 | Machining Position Storage Unit |
| 108 | Cutting Condition Storage Unit |
| 109 | Marking Condition Storage Unit |
| 110 | Surface Reforming Condition Storage Unit |
| 111 | Aperture |
| 150 | Warm-Air Convection Generator |
| 151 | Local Preheating Table |
| 152 | Non-Contact Part |
| 153 | Bare IC Chip |
| 154 | Overall Heating Device |
| 155 | Glass |
| 156 | Lamp |
| 157 | Local Hot Air Generator |
| 158 | Mounted Component |
| 159 | Solder Cream |
| 160 | Substrate |
| 200 | Workpiece Type Input Unit |
| 201 | Heating Temperature Display |
| 202a, 202b | Temperature Sensor |
| 203 | Heating Temperature Setting Unit |
| 204a, 204b | Workpiece Fixing Units |
| 205a, 205b | Workpiece Positioning Unit |
| 206a, 206b | Float Detector |
| 207 | Periodic Functioning Checker |
| 208a, 208b, 209c | Teaching Input Selection |
| 209 | Identification Code |
| 210 | Identifying Unit |
| 211 | Processor |
| 212 | Database |
| 213 | Machining Condition |
| 214 | Reflow Furnace |
| 215 | Mounter |
| 216 | Inspector |
| 217 | Inspection Result |
| 218 | Dispenser |
| 219 | Measuring Unit |
| 220 | Light Energy |
| 222 | Set Value |
| 223 | Comparator |

The invention claimed is:

1. A machining apparatus for machining a workpiece which includes a substrate, a component, and a joining material for joining the component to the substrate, the joining material comprising a solvent, said machining apparatus comprising:
a light source for generating a light energy;
an optical system for guiding said generated light energy to a joint position of the workpiece;
a table on which the workpiece is mounted;
a heating device provided at the table, for heating the workpiece;
a power supply for supplying electric power to the light source;
a first controller for controlling the power supply and the optical system;
a status recognizing unit for detecting a status of the workpiece;
a driver for moving the table; and
a second controller for controlling the driver, the second controller comprising an interface for exchanging a signal with the first controller,
wherein the heating device sets a temperature of the joining material to a temperature lower than and close to a boiling point of the solvent, and
wherein the first controller controls at least one of the power supply and the optical means based on the detected status.

2. The machining apparatus of claim 1, wherein the optical system and the table have the light energy guided to the joint position.

3. The machining apparatus of claim 1, further comprising:
an adjuster for changing an irradiation area of the light energy.

4. The machining apparatus of claim 1, wherein the optical system comprises:
a condenser; and
a galvano-mirror disposed closer to the joint position than the condenser.

5. The machining apparatus of claim 1, further comprising
a status recognizing unit for detecting a status of the workpiece,
wherein the first controller controls at least one of the power supply and the optical means based on the detected status.

6. The machining apparatus of claim 1, further comprising
an aperture provided between the light source and the optical system, for blocking at least a portion of the light energy.

7. The machining apparatus of claim 1, further comprising:
a heating-temperature-setting unit for setting a temperature of the heating device;
a heating-temperature display for displaying the temperature of the heating device; and
a temperature sensor for sensing the temperature of the heating device,
wherein the temperature of the heating device is held isothermally.

8. A machining apparatus
for machining a workpiece which includes a substrate, a component, and a joining material for joining the component to the substrate, the joining material comprising a solvent, said machining apparatus comprising:
a light source for generating a light energy;
an optical system for guiding said generated light energy to a joint position of the workpiece;
a table on which the workpiece is mounted;
a heating device provided at the table, for heating the workpiece,
a power supply for supplying electric power to the light source;
a first controller for controlling the power supply and the optical system; and
a periodic functioning checker for periodically checking functions of the optical system and the power supply,
wherein the heating device sets a temperature of the joining material to a temperature lower than and close to a boiling point of the solvent.

9. A machining apparatus for machining a workpiece which includes a substrate, a component, and a joining material for joining the component to the substrate, the joining material comprising a solvent, said machining apparatus comprising:
 a light source for generating a light energy;
 an optical system for guiding said generated light energy to a joint position of the workpiece;
 a table on which the workpiece is mounted; and
 a heating device provided at the table, for heating the workpiece,
 wherein the heating device sets a temperature of the joining material to a temperature lower than and close to a boiling point of the solvent, and
 wherein the light source and the optical system joint the joint position with a first level of the light energy, and then, apply a higher level of the light energy than the first level to a cutting position of the workpiece.

10. A machining apparatus for machining a workpiece which includes a substrate, a component, and a joining material for joining the component to the substrate, the joining material comprising a solvent, said machining apparatus comprising:
 a light source for generating a light energy;
 an optical system for guiding said generated light energy to a joint position of the workpiece;
 a table on which the workpiece is mounted; and
 a heating device provided at the table, for heating the workpiece,
 wherein the heating device sets a temperature of the joining material to a temperature lower than and close to a boiling point of the solvent, and
 wherein the light source and the optical system joint the joint position with a first level of the light energy, and then apply a higher level of the light energy than the first level to a marking portion of the workpiece.

11. A machining apparatus for machining a workpiece which includes a substrate, a component, and a joining material for joining the component to the substrate, the joining material comprising a solvent, said machining apparatus comprising:
 a light source for generating a light energy;
 an optical system for guiding said generated light energy to a joint position of the workpiece;
 a table on which the workpiece is mounted; and
 a heating device provided at the table, for heating the workpiece,
 wherein the heating device sets a temperature of the joining material to a temperature lower than and close to a boiling point of the solvent, and
 wherein the light source and the optical system joint the joint position with a first level of the light energy, and then apply a higher level of the light energy than the first level to a surface reforming portion of the workpiece.

12. A machining apparatus for machining a workpiece which includes a substrate, a component, and a joining material for joining the component to the substrate, the joining material comprising a solvent, said machining apparatus comprising:
 a light source for generating a light energy;
 an optical system for guiding said generated light energy to a joint position of the workpiece;
 a table on which the workpiece is mounted;
 a heating device provided at the table, for heating the workpiece,
 a workpiece-type input unit for inputting a type of the workpiece; and
 a second heating device for heating the workpiece,
 wherein the heating device sets a temperature of the joining material to a temperature lower than and close to a boiling point of the solvent, and
 wherein the heating device and the second heating device are switched according to the type of the workpiece.

13. A machining apparatus for machining a workpiece which includes a substrate, a component, and a joining material for joining the component to the substrate, the joining material comprising a solvent, said machining apparatus comprising:
 a light source for generating a light energy;
 an optical system for guiding said generated light energy to a joint position of the workpiece;
 a table on which the workpiece is mounted;
 a heating device provided at the table, for heating the workpiece,
 a workpiece-fixing unit for fixing the workpiece to the heating device; and
 a workpiece-positioning unit for positioning the workpiece at the heating device,
 wherein the heating device sets a temperature of the joining material to a temperature lower than and close to a boiling point of the solvent.

14. A machining apparatus for machining a workpiece which includes a substrate, a component, and a joining material for joining the component to the substrate, the joining material comprising a solvent, said machining apparatus comprising:
 a light source for generating a light energy;
 an optical system for guiding said generated light energy to a joint position of the workpiece;
 a table on which the workpiece is mounted;
 a heating device provided at the table, for heating the workpiece; and
 a float detector for detecting float of the workpiece from the table,
 wherein the heating device sets a temperature of the joining material to a temperature lower than and close to a boiling point of the solvent.

15. A machining apparatus for machining a workpiece which includes a substrate, a component, and a joining material for joining the component to the substrate, the joining material comprising a solvent, said machining apparatus comprising:
 a light source for generating a light energy;
 an optical system for guiding said generated light energy to a joint position of the workpiece;
 a table on which the workpiece is mounted;
 a heating device provided at the table, for heating the workpiece, and
 teaching-input selecting means for selecting a way of teaching the joint position,
 wherein the heating device sets a temperature of the joining material to a temperature lower than and close to a boiling point of the solvent.

16. A machining method comprising the steps of:
 providing a workpiece which includes first and second components, and a joining material for jointing the first component with the second component, the joining material comprising a solvent;

positioning the workpiece at a predetermined position;
heating a portion of the positioned workpiece to set a temperature of the joining material to a temperature lower than and close to a boiling point of the solvent; and
jointing the workpiece by applying light energy having a first level to a joint position of the workpiece after said step of heating the portion,
wherein said step of heating the portion includes the sub-step of setting a temperature of the portion to a temperature lower than a temperature increased by the applied light energy.

17. The machining method of claim 16, further comprising the step of generating a convection near the portion of the workpiece.

18. The machining method of claim 16, wherein said step of heating the portion includes the sub-step of heating only the portion and an area near the portion.

19. The machining method of claim 16, wherein said step of heating the portion includes the sub-step of heating the workpiece entirely.

20. The machining method of claim 16, wherein said step of heating the portion includes the sub-step of blowing hot air to the portion.

21. The machining method of claim 16, wherein said step of jointing the workpiece includes the sub-step of applying the light energy only to the joint portion and a portion near the joint position.

22. The machining method of claim 16,
wherein the workpiece includes another joint position; and
wherein said step of jointing the workpiece includes the sub-step of applying the light energy to the joint position and the another joint position simultaneously.

23. The machining method of claim 16,
wherein the workpiece includes another joint position; and
wherein said step of jointing the workpiece includes the sub-step of jointing the joint position and the another joint position through changing a position where the light energy is applied.

24. The machining method of claim 16, wherein said step of jointing the workpiece includes the sub-step of applying the light energy to the joint position slantingly.

25. The machining method of claim 16, wherein said step of jointing the workpiece includes the sub-steps of:
detecting a status of the joint position; and
controlling an amount of the applied light energy according to the detected status.

26. A machining method comprising the steps of:
providing a workpiece which includes first and second components, and a joining material for jointing the first component with the second component, the joining material comprising a solvent;
positioning the workpiece at a predetermined position;
heating a portion of the positioned workpiece to set a temperature of the joining material to a temperature lower than and close to a boiling point of the solvent; and
jointing the workpiece by applying light energy having a first level to a joint position of the workpiece after said step of heating the portion,
wherein said step of heating the portion includes the sub-step of applying light energy having a second level to the portion, the second level being smaller than the first level.

27. A machining comprising the steps of:
providing a workpiece which includes first and second components, and a joining material for jointing the first component with the second component, the joining material comprising a solvent;
positioning the workpiece at a predetermined position;
heating a portion of the positioned workpiece to set a temperature of the joining material to a temperature lower than and close to a boiling point of the solvent; and
jointing the workpiece by applying light energy having a first level to a joint position of the workpiece after said step of heating the portion,
wherein the workpiece includes another joint position; and
wherein said step of jointing the workpiece includes the sub-step of setting a an amount of the light energy to be applied to the joint positions and the another joint point.

28. A machining comprising the steps of:
providing a workpiece which includes first and second components, and a joining material for jointing the first component with the second component, the joining material comprising a solvent;
positioning the workpiece at a predetermined position;
heating a portion of the positioned workpiece to set a temperature of the joining material to a temperature lower than and close to a boiling point of the solvent; and
jointing the workpiece by applying light energy having a first level to a joint position of the workpiece after said step of heating the portion,
wherein said step of jointing the workpiece includes the sub-steps of:
increasing the light energy after a lapse of a first time from starting applying the light energy; and
decreasing the light energy after a lapse of a second time from increasing the light energy.

29. A machining method comprising the steps of:
providing a workpiece which includes first and second components, and a joining material for jointing the first component with the second component, the joining material comprising a solvent;
positioning the workpiece at a predetermined position;
heating a portion of the positioned workpiece to set a temperature of the joining material to a temperature lower than and close to a boiling point of the solvent; and
jointing the workpiece by applying light energy having a first level to a joint position of the workpiece after said step of heating the portion,
wherein the workpiece includes another joint position; and
wherein said step of jointing the workpiece includes the sub-step of repeating to apply the light energy to the joint position and the another joint position alternatively by time division.

30. Production equipment comprising a machining apparatus comprising:
a light source for generating a light energy;
an optical system for guiding said generated light energy to a joint position of a workpiece which includes a substrate, a component, and a joining material for joining the component to the substrate, the joining material comprising a solvent;
a table on which the workpiece is mounted;
a heating device provided at the table, for heating the workpiece;

a dispenser for applying the joining material to the joint position of the workpiece;

a mounter for mounting an object to a position where the joining material is applied; and a measuring unit for measuring a time elapsed from the applying of the joining material by the dispenser to the applying the light energy by the machining apparatus, wherein the heating device of the machining apparatus sets a temperature of the joining material to a temperature lower than and close to a boiling point of the solvent, wherein the machining apparatus applies the light energy to a joint position of the object, and wherein at least one of the light energy and the heating device is adjusted according to an output of the measuring unit.

31. The production equipment of claim 30, further comprising:

an identifying unit for identifying a type of the workpiece;

a database for storing a machining condition corresponding to the type of the workpiece; and a processor for retrieving the machining condition from the database according to the type identified, wherein the machining apparatus captures the machining condition according to a signal from the processor.

32. The production equipment of claim 30, further comprising a reflow furnace for reflow-machining the workpiece and for sending the reflow-machined workpiece to the machining apparatus.

33. The production equipment of claim 32, further comprising an inspector for inspecting a joined state of a joint position of the reflow-machined workpiece, wherein the machining apparatus joints another joint position of the workpiece based on the joined state inspected by the inspector.

34. The production equipment of claim 30, further comprising an inspector for inspecting a joined state of a joint position jointed by the machining apparatus, wherein the machining apparatus joints another joint position of the workpiece according to the joined state inspected by the inspector.

35. The production equipment of claim 30, further comprising a comparator for comparing the output from the measuring unit with a predetermined value, wherein the at least one of the light energy and the heating device is adjusted according to an output from the comparator.

36. The production equipment of claim 30, further comprising an inspector for inspecting a joined state of the workpiece which is jointed by the machining apparatus, wherein the machining apparatus joints another joint position of the workpiece according to the joined state inspected by the inspector.

* * * * *

UNITED STATES PATENT AND TRADEMARK OFFICE
CERTIFICATE OF CORRECTION

| | |
|---|---|
| PATENT NO. | : 6,998,572 B2 |
| APPLICATION NO. | : 10/433999 |
| DATED | : February 14, 2006 |
| INVENTOR(S) | : Endo et al. |

It is certified that error appears in the above-identified patent and that said Letters Patent is hereby corrected as shown below:

In column 24, line 19, "A machining comprising" should read --A machining method comprising--.

Signed and Sealed this

Twenty-second Day of August, 2006

JON W. DUDAS
*Director of the United States Patent and Trademark Office*